United States Patent
Miyashita

(10) Patent No.: US 11,927,916 B2
(45) Date of Patent: *Mar. 12, 2024

(54) WATCH COMPONENT, WATCH MOVEMENT AND WATCH

(71) Applicant: Seiko Epson Corporation, Tokyo (JP)

(72) Inventor: Kazuyuki Miyashita, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 1026 days.

This patent is subject to a terminal disclaimer.

(21) Appl. No.: 16/817,781

(22) Filed: Mar. 13, 2020

(65) Prior Publication Data

US 2020/0292991 A1 Sep. 17, 2020

(30) Foreign Application Priority Data

Mar. 14, 2019 (JP) ................. 2019-046905

(51) Int. Cl.
| | |
|---|---|
| *G04B 1/16* | (2006.01) |
| *B81C 3/00* | (2006.01) |
| *G04B 13/02* | (2006.01) |
| *G04B 15/14* | (2006.01) |

(52) U.S. Cl.
CPC ............... *G04B 1/16* (2013.01); *G04B 13/02* (2013.01); *G04B 13/022* (2013.01); *G04B 15/14* (2013.01); *B81C 3/001* (2013.01); *B81C 3/005* (2013.01)

(58) Field of Classification Search
CPC .... G04B 13/026; G04B 13/022; G04B 15/14; B81C 3/001; B81C 3/005
See application file for complete search history.

(56) References Cited

U.S. PATENT DOCUMENTS

| | | |
|---|---|---|
| 2002/0131332 A1 | 9/2002 | Kaelin et al. |
| 2004/0150869 A1* | 8/2004 | Kasai .................. B81B 3/0083 |
| | | 359/290 |
| 2009/0081476 A1 | 3/2009 | Saucy |
| 2014/0356638 A1 | 12/2014 | Wang |
| 2016/0161640 A1 | 6/2016 | Furusato |
| 2016/0378064 A1* | 12/2016 | Gandelhman .......... G04B 19/12 |
| | | 368/139 |
| 2017/0068221 A1 | 3/2017 | Dubois |
| 2017/0168460 A1 | 6/2017 | Willemin |
| 2018/0004161 A1* | 1/2018 | Gaff ...................... B81B 3/0081 |
| 2018/0104771 A1 | 4/2018 | Cusin et al. |
| 2018/0142749 A1* | 5/2018 | Maennicke ............... F16F 1/10 |

(Continued)

FOREIGN PATENT DOCUMENTS

| | | | | |
|---|---|---|---|---|
| CH | | 713536 A2 * | 9/2018 | ........... C09C 1/0015 |
| JP | H04-318491 A | | 11/1992 | |

(Continued)

*Primary Examiner* — Edwin A. Leon
*Assistant Examiner* — Kevin Andrew Johnston
(74) *Attorney, Agent, or Firm* — Harness, Dickey & Pierce, P.L.C.

(57) ABSTRACT

For example, an escape gear wheel part as a watch component includes a base member including a first surface and a second surface opposite the first surface, the base member being mainly composed of silicon, and a light reflecting layer provided at the first surface of the base member, the light reflecting layer having a three-layer structure in which a first silicon oxide layer, a silicon layer, and a second silicon oxide layer are layered in this order.

20 Claims, 20 Drawing Sheets

(56) References Cited

U.S. PATENT DOCUMENTS

| | | |
|---|---|---|
| 2018/0150029 A1 | 5/2018 | Shibuya et al. |
| 2018/0372150 A1 | 12/2018 | Papi et al. |
| 2018/0373201 A1 | 12/2018 | Tu |
| 2019/0076876 A1 | 3/2019 | Shibuya |
| 2021/0018875 A1* | 1/2021 | Funakawa ............ G04B 19/103 |

FOREIGN PATENT DOCUMENTS

| | | | |
|---|---|---|---|
| JP | 2016-114407 A | 6/2016 | |
| JP | 2017-053853 A | 3/2017 | |
| JP | 2018-087736 A | 6/2018 | |
| WO | 1993-017593 A1 | 9/1993 | |
| WO | WO-2015087252 A1 * | 6/2015 | ............ G04B 17/06 |

* cited by examiner

WATCH COMPONENT, WATCH MOVEMENT AND WATCH

The present application is based on, and claims priority from JP Application Serial Number 2019-046905, filed Mar. 14, 2019, the disclosure of which is hereby incorporated by reference herein in its entirety.

BACKGROUND

1. Technical Field

The present disclosure relates to a watch component, a watch movement, and a watch.

2. Related Art

While watch components have been formed by machining a metal material in the related art, a base member containing silicon has been used in recent years as a material for watch components from the perspective of weight reduction and processability.

In addition, in recent years, decorativeness is desired not only for the watch components that are exposed to the outside of the watch, but also for the watch components incorporated inside the watch.

For example, JP-A-2016-114407 discloses a watch having a see-through structure that allows for external visual recognition of a watch component disposed inside the case from the dial side or from the case back side.

For the watch with the see-through structure disclosed in JP-A-2016-114407 that allows for external visual recognition of the interior of the case, there is a need for enhancing the decorativeness of the watch components that can be viewed from the outside of the case. Further, also for watches of the related art, there is a demand for further enhancing the decorativeness of the watch components.

SUMMARY

A watch component of the present disclosure includes: a base member including a first surface and a second surface opposite the first surface, the base member being mainly composed of silicon; and a light reflecting layer provided at the first surface of the base member, the light reflecting layer having a three-layer structure in which a first silicon oxide layer, a silicon layer, and a second silicon oxide layer are layered in this order.

In the watch component of the present disclosure, an average thickness of the second silicon oxide layer may be smaller than an average thickness of the first silicon oxide layer.

In the watch component of the present disclosure, an average thickness of the silicon layer may be from 66 nm to 86 nm.

In the watch component of the present disclosure, an average thickness of the first silicon oxide layer may be from 100 nm to 400 nm.

In the watch component of the present disclosure, a light reflecting layer having a three-layer structure in which a first silicon oxide layer, a silicon layer, and a second silicon oxide layer are layered in this order may be further provided at the second surface of the base member.

In the watch component of the present disclosure, a light reflecting layer having a three-layer structure in which a first silicon oxide layer, a silicon layer, and a second silicon oxide layer are layered in this order may be further provided at a side surface where the first surface and the second surface are coupled.

In the watch component of the present disclosure, a maximum reflectance for light having a wavelength in a range from 400 nm to 780 nm when the light is incident on the light reflecting layer at an incident angle of 0° may be 50% or greater.

In the watch component of the present disclosure, the watch component may be at least one selected from the group consisting of a barrel, a wheel, an escape wheel, an anchor, and a balance.

A method for manufacturing a watch component of the present disclosure includes forming a light reflecting layer at a first surface of a base member including the first surface and a second surface opposite the first surface, the base member being mainly composed of silicon, the light reflecting layer having a three-layer structure in which a first silicon oxide layer, a silicon layer, and a second silicon oxide layer are layered in this order.

In the above-mentioned method of the present disclosure, at least one of the first silicon oxide layer and the second silicon oxide layer may be formed by a thermal oxidation method.

In the above-mentioned method of the present disclosure, the silicon layer may be formed by a low-pressure CVD method.

A watch movement of the present disclosure includes the above-mentioned watch component.

A watch of the present disclosure includes the above-mentioned watch component.

The watch of the present disclosure may be a mechanical watch having a see-through structure.

DESCRIPTION OF EXEMPLARY EMBODIMENTS

Watch Component

A watch component of the present disclosure is a concept that includes a watch interior component, and a screw for securing watch components, in addition to a watch exterior component exposed to the outside of a watch.

Examples of the watch exterior part include a watch case, a watch band, a dial, a watch hand, a bezel, a crown, a button, a cover glass, a glass edge, a dial ring, a panel cover and a packing. Examples of the watch case include a body, a case back, and a one-piece case where the body and the case back are integrated. Examples of the watch band include a band clasp, a part used for attaching and detaching the band, and a part used for attaching and detaching a bangle. Examples of the bezel include a rotating bezel. Examples of the crown include a thread-locking crown.

Examples of the watch interior component include a barrel, a wheel, an escape wheel, an anchor, a balance and a mainspring.

Among them, from the perspective of presenting more decorativeness, the watch component is preferably a watch interior component, more preferably at least one selected from the group consisting of a barrel, a wheel, an escape wheel, an anchor, and a balance.

In other words, from the perspective of presenting more decorativeness, the watch component is preferably mounted in a watch of a see-through structure whose inner mechanism is visible.

First Embodiment

A first embodiment of the present disclosure is described below with reference to the accompanying drawings.

In the first embodiment, an escape gear wheel part constituting an escape wheel is described as an example of a watch component. A mechanical watch is described as an example of a watch provided with the escape gear wheel part.

Figure 1:
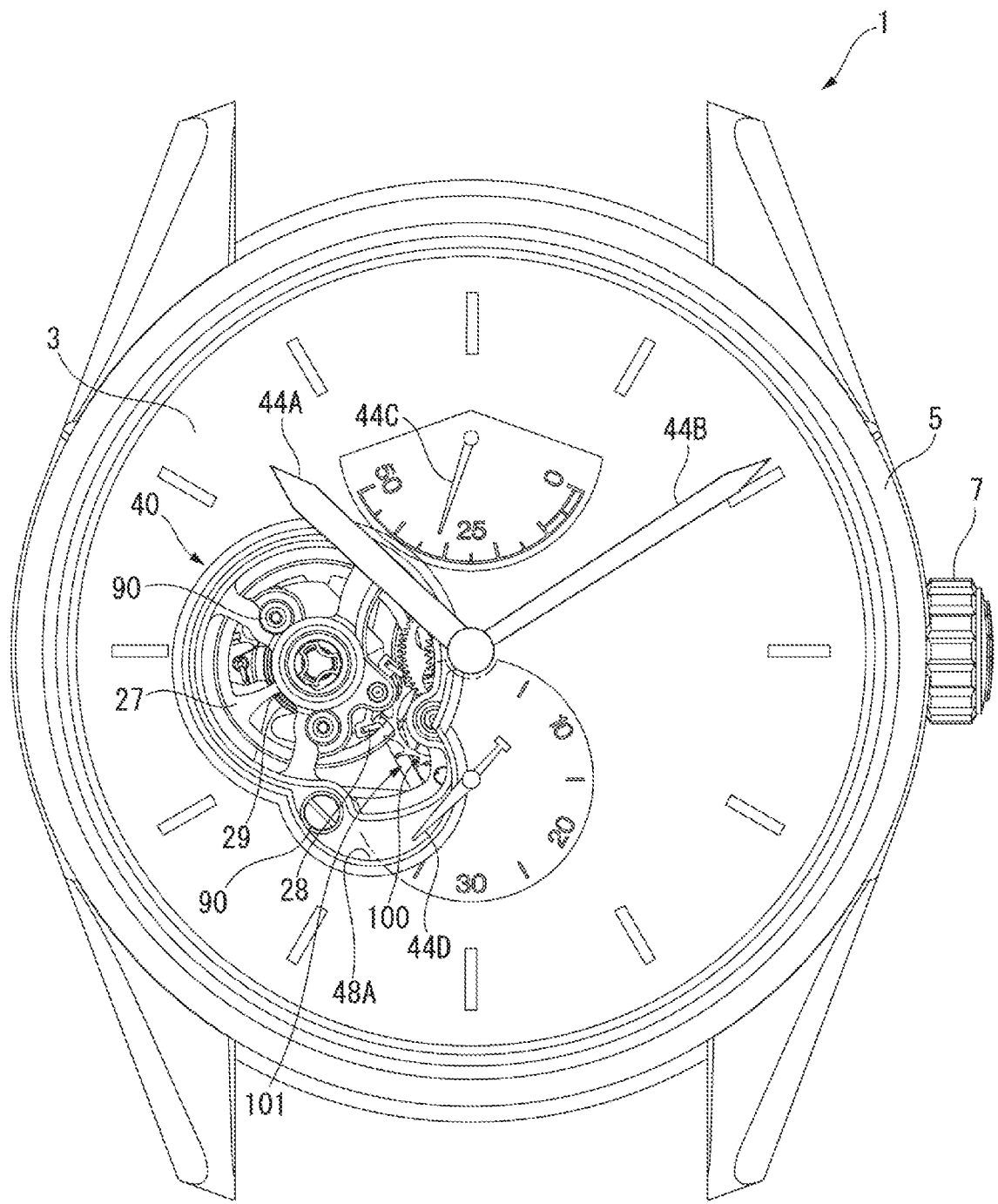
FIG. 1 is a plan view of a mechanical watch according to a first embodiment as viewed from the dial side.
Figure 2:
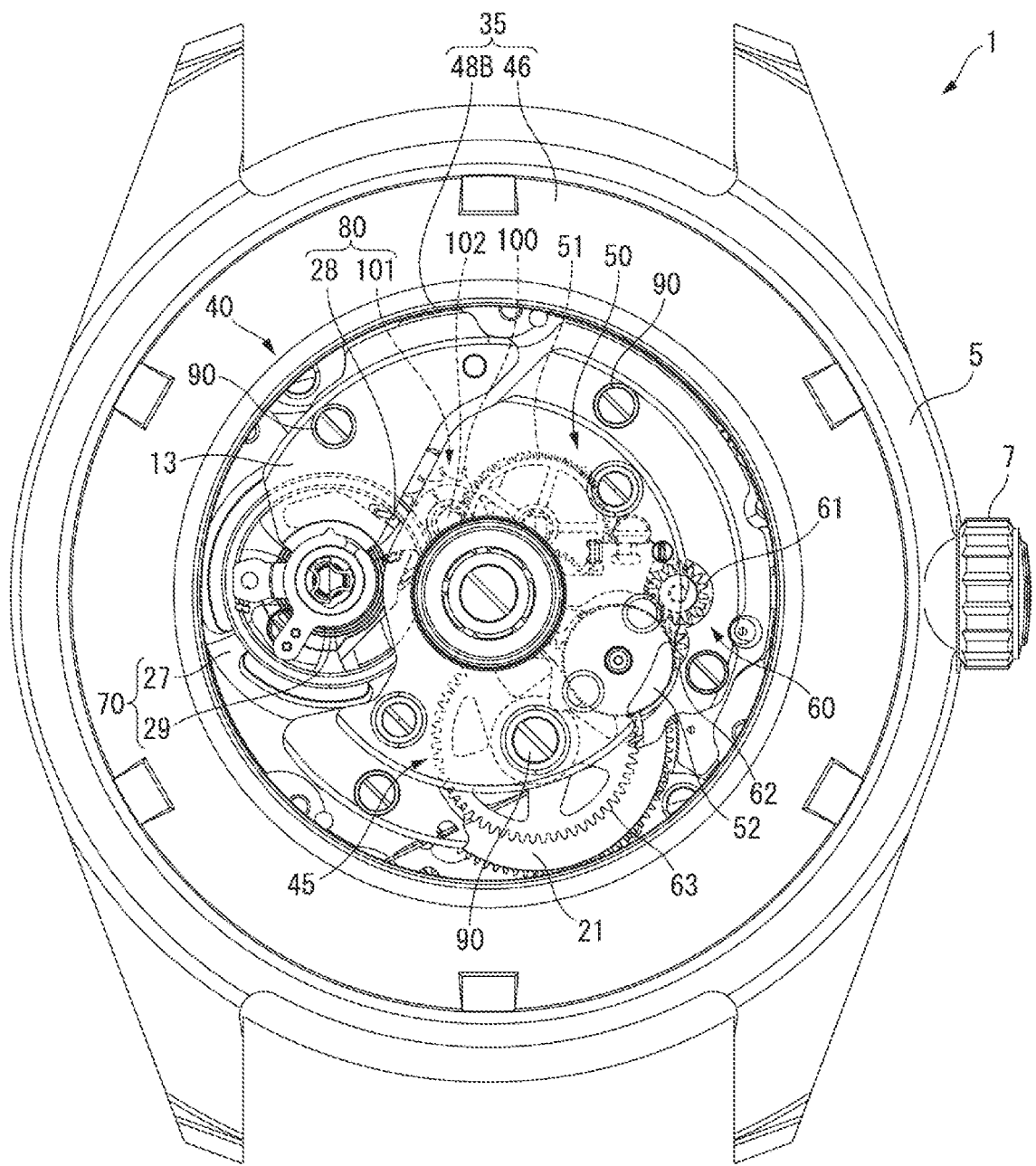
FIG. 2 is a plan view of the mechanical watch according to the first embodiment as viewed from the case back side.

FIG. 1 is a plan view illustrating a mechanical watch 1 according to the first embodiment as viewed from the dial side. FIG. 2 is a plan view of the mechanical watch 1 according to the first embodiment as viewed from the case back side. Note that, regarding screws 90 for securing the components of the watch, only some of them are designated with the reference sign.

The mechanical watch 1 has a see-through structure in which a part of a movement 40 is visible from the dial side or the case back side.

A plan view of the mechanical watch 1 as viewed from the dial side is described with reference to FIGS. 1 and 2.

The mechanical watch 1 includes a cylindrical outer case 5, and a disk-shaped dial 3 is disposed on an inner circumferential side of the outer case 5. A window 48A is provided in the dial 3. The mechanical watch 1 is configured such that a part of the movement 40 is visible through the window 48A.

Of two openings of the outer case 5, the opening on the front side is covered with a cover glass, and a case back 35 is attached to the opening on the rear side.

The mechanical watch 1 includes a movement 40 housed in the outer case 5, an hour hand 44A that indicates time information, a minute hand 44B, a power reserve hand 44C that indicates mainspring duration, and a small second 44D.

The watch hand 44A, the minute hand 44B, the power reserve needle 44C, and the small second 44D are attached to a hand shaft of the movement 40 and are driven by the movement 40.

A crown 7 is provided on a side surface of the outer case 5. By operating the crown 7, an input corresponding to the operation can be made.

In FIG. 1, an escape wheel 101, an anchor 28, a balance wheel 27, a balance spring 29 and the like that constitute a part of the movement 40 are visible from the dial side through the window 48A provided in the dial 3. The escape wheel 101 includes a shaft member 102 and the escape gear wheel part 100 as the watch component according to the first embodiment.

The configuration of the escape gear wheel part 100 is described later.

A plan view of the mechanical watch 1 as viewed from the case back side is described with reference to FIGS. 1 and 2.

The case back 35 is composed of a ring-shaped frame material 46 defining an outer peripheral portion, and a window 48B made of a transparent member fitted to the frame material 46.

The movement 40 includes a wheel train 45, a balance bridge 13, a manual winding mechanism 60, an automatic winding mechanism 50, and the like.

The wheel train 45 includes a barrel 21, a center wheel, a third wheel, a fourth wheel 51, the escape wheel 101, the anchor 28, the balance wheel 27 and the like provided on the case back side of the main plate. FIG. 2 illustrates the barrel 21, the fourth wheel 51, the escape wheel 101, the anchor 28 and the balance wheel 27. The escape wheel 101 and the anchor 28 constitute an escapement 80, and the balance wheel 27 and the balance spring 29 constitute a speed governor 70.

The manual winding mechanism 60 includes a stem, a winding wheel, a clutch wheel, a crown wheel 61, a ratchet transmission wheel 62, a ratchet wheel 63, and the like. FIG. 2 illustrates the crown wheel 61, the ratchet transmission wheel 62, and the ratchet wheel 63.

The automatic winding mechanism 50 includes a rotation weight, a bearing, an eccentric wheel, a claw lever, a transmission wheel 52, and the like. FIG. 2 illustrates the transmission wheel 52.

In FIG. 2, the barrel 21, the escape wheel 101, the anchor 28, the balance wheel 27, the crown wheel 61, the ratchet transmission wheel 62, the ratchet wheel 63, the eccentric wheel, the transmission wheel 52 and the like that constitute a part of the movement 40 are visible from the case back side through the window 48B provided in the case back 35.

In the mechanical watch 1, the aspect for visual recognition of components of the movement 40 from the dial side or the case back side is not limited to the above-described aspect.

For example, the design, size, arrangement position, number of windows, and the like of the windows 48A and 48B may be appropriately changed such that desired components of the movement 40 are visible.

In addition, the entirety of the dial 3 may be formed with a transparent member such that the entirety of the movement 40 is visible from the dial side, and the entirety of the case back 35 may be formed with a transparent member such that the entirety of the movement 40 is visible from the case back side.

Next, a configuration of the escape gear wheel part 100 according to the first embodiment is described in detail.

Figure 3:
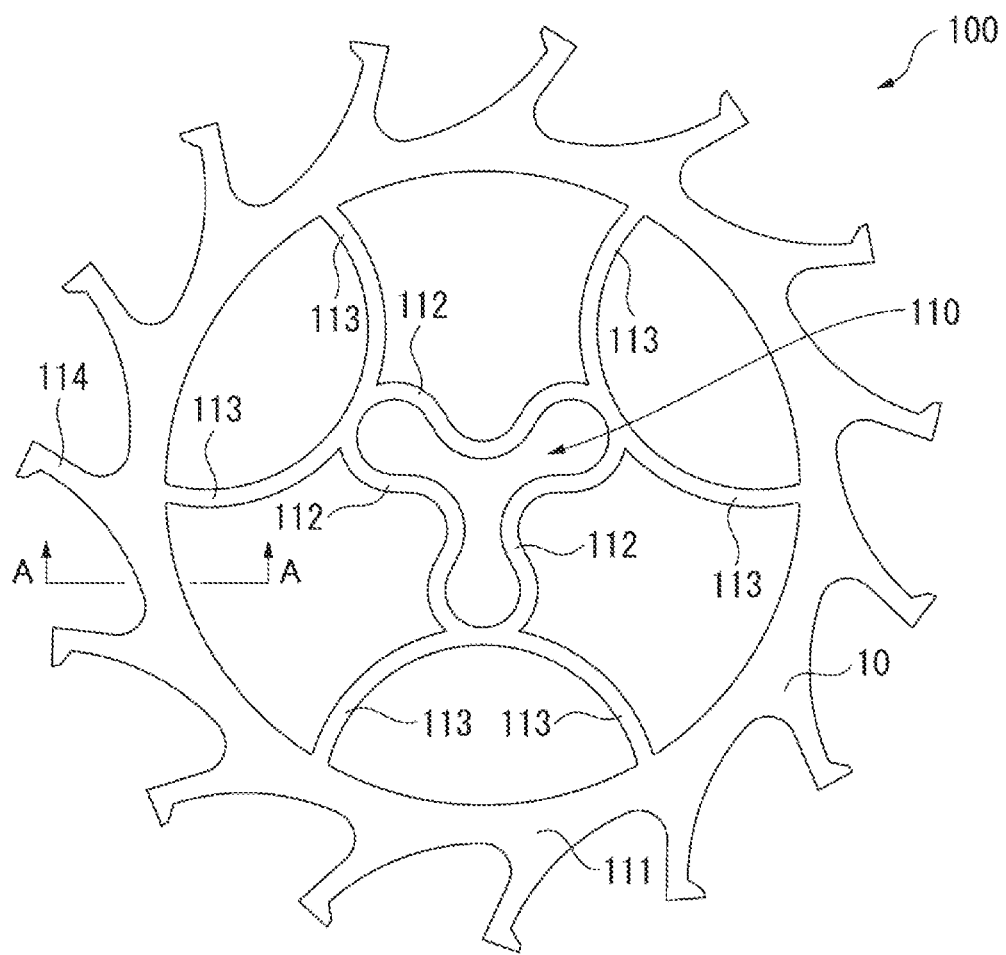
FIG. 3 is a plan view of an escape gear wheel part according to the first embodiment.
Figure 4:
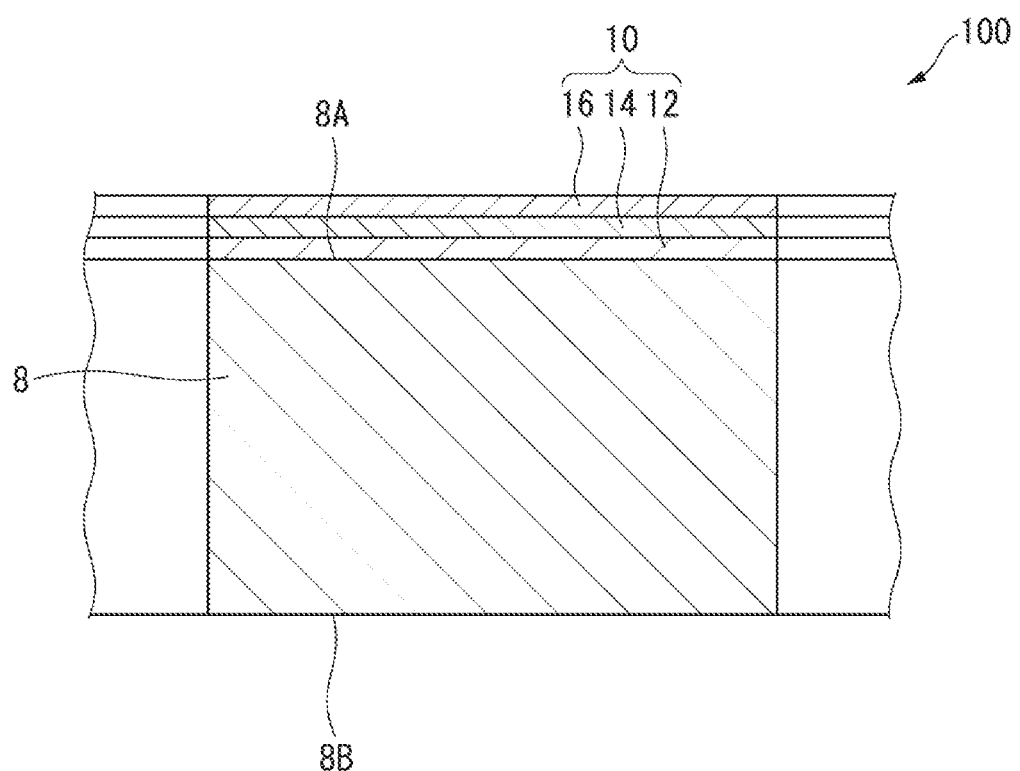
FIG. 4 is a schematic cross-sectional view taken along the line A-A of FIG. 3.

FIG. 3 is a plan view of the escape gear wheel part 100 according to the first embodiment. FIG. 4 is a partial cross-sectional view taken along the line A-A of FIG. 3.

The escape gear wheel part 100 of the first embodiment includes a base member 8 mainly composed of silicon. The base member 8 includes a first surface 8A and a second surface 8B opposite the first surface 8A.

A light reflecting layer 10 having a three-layer structure in which a first silicon oxide layer 12, a silicon layer 14, and a second silicon oxide layer 16 are layered in this order is provided on the first surface 8A of the base member 8.

In the present specification, the first surface of the base member means a surface on the side from which the watch component is visible when the watch component is mounted in the watch.

In the case where the watch component is visible from the case back side of the watch when the watch component is mounted in the watch, the first surface of the base member means the surface located on the case back side of the watch. Note that, in the case where the watch component is visible from both the case back side and the dial side of the watch, the first surface of the base member is the surface located on the dial side of the watch.

In this embodiment, the escape gear wheel part 100 as the watch component is visible from both the case back side and the dial side of the mechanical watch 1, and therefore the first surface 8A of the base member 8 is the surface located on the dial side, and the second surface 8B of the base member 8 is the surface located on the case back side.

In the present specification, the base member means a watch component of a state in which no light reflecting layer is formed. In this embodiment, the base member 8 means an escape gear wheel part of a state in which the light reflecting layer 10 is not formed.

In the present specification, "mainly composed of silicon" means that the content of silicon of the entire base member is 80 mass % or greater. The content of the silicon is preferably 90 mass % or greater, more preferably 95 mass % or greater.

In the following description, the base member 8 mainly composed of silicon may be referred to as the base member 8 made of silicon.

Base Member

The base member 8 is mainly composed of silicon. The type of silicon is not limited, and may be appropriately selected from the perspective of processability. Examples of the silicon include monocrystalline silicon and polycrystalline silicon. They may be used alone or in combination.

The base member 8 made of silicon can be manufactured by, for example, a photolithography technique and an etching technique, and thus a complex shape can be formed.

Light Reflecting Layer

The light reflecting layer 10 has a three-layer structure in which the first silicon oxide layer 12, the silicon layer 14, and the second silicon oxide layer 16 are layered in this order on the first surface 8A of the base member 8.

The light reflecting layer 10 has a function of freely adjusting transmission and/or reflection of light at least at one of a surface of the second silicon oxide layer 16 opposite the silicon layer 14, an interface between the second silicon oxide layer 16 and the silicon layer 14, an interface between the silicon layer 14 and the first silicon oxide layer 12, and the first surface 8A of the base member 8.

As illustrated in FIG. 4, the outermost layer of the light reflecting layer 10 is the second silicon oxide layer 16. Thus, the protection of the escape gear wheel part 100 is enhanced.

While the average thickness of the light reflecting layer is adjusted in accordance with the coloring, the average thickness is preferably from 265 nm to 885 nm from the perspective of productivity.

First Silicon Oxide Film

A first silicon oxide layer 12 is provided on the first surface 8A of the base member 8.

While the average thickness of the first silicon oxide layer 12 is adjusted in accordance with the coloring, the average thickness of the first silicon oxide layer 12 is typically from 100 nm to 450 nm, and is preferably from 100 nm to 400 nm. When the average thickness of the first silicon oxide layer 12 is 100 nm or greater, the thickness can be easily controlled. When the average thickness of the first silicon oxide layer 12 is 400 nm or smaller, the film formation time can be shortened, and as a result the productivity is improved.

For example, when the escape gear wheel part 100 is colored blue, the average thickness of the first silicon oxide layer 12 is preferably from 20 nm to 100 nm, or from 180 nm to 290 nm, or, 330 nm or greater, more preferably from 210 nm to 280 nm. Note that the upper limit value is preferably 450 nm or smaller from the perspective of productivity. A proper range of the average thickness of the first silicon oxide layer 12 can be calculated, for example, by the optical calculation described in the Examples described later.

The first silicon oxide layer 12 is preferably a thermally oxidized silicon layer formed by a thermal oxidation method. When the thermally oxidized silicon layer 12 is formed by a thermal oxidation method, a silicon layer with high uniformity can be easily obtained. Thus, the escape gear wheel part 100 is more easily colored with the same color.

Silicon Oxide Film

The silicon layer 14 is provided on the first silicon oxide layer 12.

The average thickness of the silicon layer 14 is preferably from 66 nm to 86 nm.

When the average thickness of the silicon layer 14 is from 66 nm to 86 nm, the color is easily controlled.

For example, when the escape gear wheel part 100 is colored blue, the average thickness of the silicon layer 14 is more preferably from 70 nm to 84 nm from the perspective of suppressing the coloring difference depending on the observation angle. A preferred range of the average thickness of the silicon layer 14 can be calculated, for example, by the optical calculation described in the Examples described later.

While the silicon layer 14 may be an amorphous layer or a polysilicon layer, the silicon layer 14 is preferably a polysilicon layer.

Second Silicon Oxide Film

The second silicon oxide layer 16 is provided on the silicon layer 14.

For example, when the escape gear wheel part 100 is colored blue, the average thickness of the second silicon oxide layer 16 is from 100 nm to 200 nm, or from 250 nm to 360 nm, or, 400 nm or greater, more preferably, from 130 nm to 200 nm, or from 310 nm to 360 nm from the perspective of reducing the coloring difference depending on the observation angle. Note that the upper limit value is preferably 500 nm or smaller from the perspective of productivity. A proper range of the average thickness of the second silicon oxide layer 16 can be calculated, for example, by the optical calculation described in the Examples described later.

The second silicon oxide layer 16 is preferably a thermally oxidized silicon layer formed by a thermal oxidation method. Since the thermally oxidized silicon layer typically has a mechanical property superior to the silicon oxide layer formed by a vapor deposition method, the protecting property of the base member 8 is further enhanced when the second silicon oxide layer 16 is composed of a thermally oxidized silicon layer. In particular, it is particularly desirable for a gear, such as the escape gear wheel part 100, having a portion that makes contact with other parts since the mechanical strength of the contact portion is enhanced.

While the average thickness of the second silicon oxide layer 16 is adjusted in accordance with the coloring, the average thickness of the second silicon oxide layer 16 is preferably smaller than the average thickness of the first silicon oxide layer 12.

In the thermal oxidation method, a silicon layer formed prior to formation of the second silicon oxide layer 16 is oxidized to form the second silicon oxide layer 16, for example. In this case, since the silicon layer is composed of an amorphous layer or a polysilicon layer, it is difficult to control the thickness of the second silicon oxide layer 16. Typically, the layer thickness of the second silicon oxide layer 16 is preferably thin since the smaller the layer thickness, the easier the layer thickness control. Therefore, the average thickness of the second silicon oxide layer 16 is preferably smaller than the average thickness of the first silicon oxide layer 12.

The average thicknesses of the first silicon oxide layer 12, the silicon layer 14, and the second silicon oxide layer 16 can be measured by the following method.

A portion of the escape gear wheel part 100 as a watch component is cut out and used as a test piece. The cross section of the test piece is observed using a SEM (scanning electron microscope), the thickness of the measurement object layer is measured at arbitrary ten points, and the average value thereof is used as the "average thickness of the measurement object layer".

The measurement object layer is any of the first silicon oxide layer 12, the silicon layer 14, and the second silicon oxide layer 16.

Operational Effect

Since the escape gear wheel part 100 of the first embodiment includes the light reflecting layer 10 in which a silicon oxide layer, which is a relatively low refractive index layer, and a silicon layer, which is a relatively high refractive index layer, are alternately stacked in three layers on the first surface 8A of the base member 8 made of silicon, and thus can be decorated with favorable coloring in comparison with the case where one silicon oxide layer is layered on the first surface 8A of the base member 8. As a result, the escape gear wheel part 100 having excellent decorativeness is achieved.

In addition, since the base member 8 is made of silicon and each layer of the light reflecting layer 10 is composed of a material including silicon in the escape gear wheel part 100, the adhesion between the base member 8 and the first silicon oxide layer 12 and the adhesion between each layer of the light reflecting layer 10 are conceivably favorable. As a result, the adhesive layer that is typically provided between the base member and the light reflecting layer 10 is unnecessary, and the durability of the structure is improved in its entirety.

Further, since the second silicon oxide layer 16, which is the silicon oxide layer, is disposed at the outermost layer, the escape gear wheel part 100 has a structure in which the protective property of the base member 8 is enhanced. Conceivably, a physically and chemically stable second silicon oxide layer 16 can also provide a function as a protective material for the base member 8.

All of the base member 8 and the light reflecting layer include silicon and the escape gear wheel part 100 can be decorated with favorable coloring, and thus, the escape gear wheel part 100 has a configuration that does not exist in the related art.

Properties of Watch Component

A desired color can be given to the escape gear wheel part 100 of the first embodiment by adjusting the average thickness of each layer of the light reflecting layer 10.

Examples of the desired color include, but not limited to, blue, green, red, yellow, pink, blue-green, and other mixed colors.

Measurement of Maximum Reflectance

In the escape gear wheel part 100 of the first embodiment, the maximum reflectance in the range from 400 nm to 780 nm with light incident on the light reflecting layer 10 at an incident angle of 0° is preferably 50% or greater, more preferably 60% or greater, still more preferably 70% or greater. Note that the incident angle of 0° is the angle of the incident light with respect to the direction of the normal to the light reflecting layer.

The maximum reflectance of the escape gear wheel part 100 can be measured using a test piece under the following condition. The escape gear wheel part 100 itself or a piece of the escape gear wheel part 100 cut into a measurable size may be used as the test piece in accordance with the specification of the measurement device.

Measurement Condition

Device: microspectrophotometer (available from Olympus; USPM-RU-W)

Measurement Environment: 25° C.

Incident Angle 0°

The maximum reflectance in the case where the escape gear wheel part 100 is colored blue is preferably 50% or greater, more preferably 60% or greater, still more preferably 70% or greater in the range from 400 nm to 550 nm.

The maximum reflectance in the case where the escape gear wheel part 100 is colored red is preferably 50% or greater, more preferably 60% or greater, still more preferably 70% or greater in the range of 600 nm to 800 nm.

The maximum reflectance in the case where the escape gear wheel part 100 is colored green is preferably 50% or greater, more preferably 60% or greater, still more preferably 70% or greater in the range from 400 nm to 600 nm.

It is also preferable that the escape gear wheel part 100 be colored a mixed color such as a blue green color and a pink color.

Method for Manufacturing Watch Component of First Embodiment

The method for manufacturing the escape gear wheel part 100 of the first embodiment includes forming the light reflecting layer 10 having a three-layer structure in which the first silicon oxide layer 12, the silicon layer 14, and the second silicon oxide layer 16 are layered in this order on the first surface 8A of the base member 8 made of silicon.

By the manufacturing method of the first embodiment, the escape gear wheel part 100 having excellent decorativeness is manufactured.

Step of Forming Light Reflecting Layer

The step of forming the light reflecting layer 10 includes a step of forming the first silicon oxide layer 12 on the first surface 8A of the base member 8, a step of forming the silicon layer 14 on the first silicon oxide layer 12, and a step of forming the second silicon oxide layer 16 on the silicon layer 14.

The base member 8 may be manufactured, or may be an available product.

The base member 8 can be manufactured by, for example, a photolithography technique and an etching technique. In addition, by using the base member 8 made of silicon, the weight reduction of the escape gear wheel part 100 is achieved in comparison with the case where a metal base member is used. In addition, complex shapes can be formed by a photolithography technique and an etching technique.

Step of Forming First Silicon Oxide Layer

Examples of the method of forming the first silicon oxide layer 12 include a thermal oxidation method, a physical vapor deposition (PVD) method, a chemical vapor deposition (CVD) method, and combinations thereof.

Examples of the thermal oxidation method include a wet oxidation method using water and a dry oxidation method using oxygen.

Examples of the PVD method include a sputtering method, an ion plating method, and a vacuum deposition method. Examples of the CVD method include a plasma chemical vapor deposition method, a thermal chemical vapor deposition method, and a photochemical vapor deposition method.

The method of forming the first silicon oxide layer 12 is preferably a thermal oxidation method using water or a dry oxidation method using oxygen.

In the case where the first silicon oxide layer 12 is formed by a thermal oxidation method, a vertical or a horizontal thermal oxidation furnace is preferably used from the perspective of productivity.

The forming condition of the first silicon oxide layer 12 are appropriately adjusted in accordance with the shape of the base member 8, the intended thickness, and the like.

Step of Forming Silicon Layer

Examples of the method of forming the silicon layer 14 include a PVD method, a CVD method, and combinations thereof.

Examples of the PVD method and the CVD method include methods similar to those described for the step of forming the first silicon oxide layer 12.

The silicon layer 14 is preferably formed by a low-pressure CVD method.

For example, by the low-pressure CVD method, the silicon layer 14 can be formed at least on the first surface 8A of the base member 8 by feeding monosilane gas under low pressure while controlling the deposition temperature at a temperature from 500° C. to 700° C. When the silicon layer 14 is formed by the low-pressure CVD method, the layer quality of the silicon layer can be controlled from amorphous silicon to polysilicon in accordance with the deposition temperature.

In the case where the silicon layer 14 is formed using the low-pressure CVD method, a vertical or horizontal low-pressure CVD furnace is preferably used from the perspective of productivity.

Preferably, the forming conditions of the silicon layer 14 are appropriately adjusted in accordance with the shape of the base member 8, the intended thickness, and the like.

Step of Forming Second Silicon Oxide Layer

Examples of the method of forming the second silicon oxide layer 16 include methods similar to the methods of forming the first silicon oxide layer 12, and the same applies to the preferable method thereof.

Among them, the second silicon oxide layer 16 is preferably formed by thermally oxidizing a portion of the silicon layer 14, as in Example 7 described later. As a result, conceivably, the function as a protective material of the second silicon oxide layer 16 is further presented.

The forming conditions of the second silicon oxide layer 16 are appropriately adjusted in accordance with the shape of the base member 8, the intended thickness, and the like.

In the manufacturing method of the first embodiment, it is preferable to form at least one of the first silicon oxide layer 12 and the second silicon oxide layer 16 by a thermal oxidation method, and it is more preferable to form both the first silicon oxide layer 12 and the second silicon oxide layer 16 by a thermal oxidation method.

Second Embodiment

Regarding a second embodiment, differences from the first embodiment are mainly described, and overlapping descriptions are omitted.

An escape gear wheel part according to the second embodiment is the same as the escape gear wheel part 100 according to the first embodiment except that a light reflecting layer having a three-layer structure in which a first silicon oxide layer, a silicon layer, and a second silicon oxide layer are layered in this order is provided on the second surface of the base member.

Figure 5:
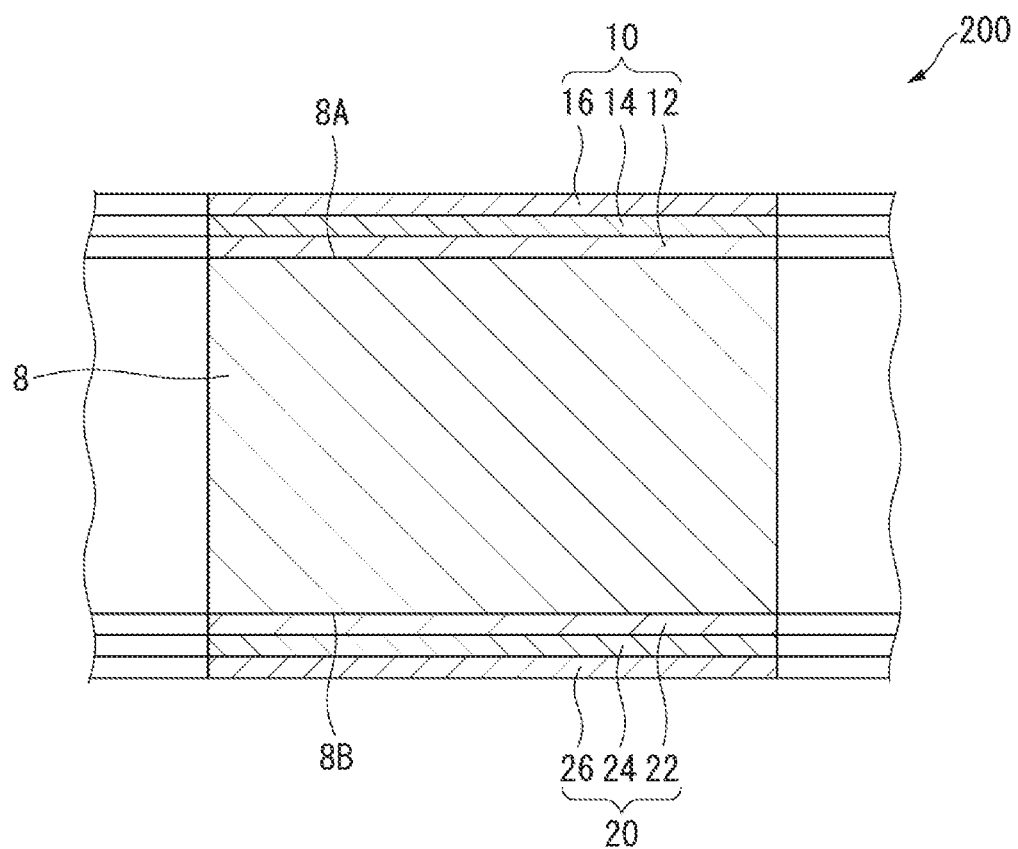
FIG. 5 is a partial cross-sectional view of an escape gear wheel part according to a second embodiment, and specifically is a partial cross-sectional view taken along the line A-A on the assumption that a light reflecting layer is also provided on a second surface of a base member in the escape gear wheel part illustrated in FIG. 3.

FIG. 5 is a partial cross-sectional view of an escape gear wheel part 200 according to the second embodiment, and specifically is a partial cross-sectional view taken along the line A-A on the assumption that the light reflecting layer 10 is provided also on the second surface 8B of the base member 8 in the escape gear wheel part 100 of FIG. 3.

As illustrated in FIG. 5, the escape gear wheel part 200 includes the light reflecting layers 10 and 20 having three-layer structures in which the first silicon oxide layers 12 and 22, the silicon layers 14 and 24, and the second silicon oxide layers 16 and 26 are layered in this order on the first surface 8A and the second surface 8B of the base member 8.

While the average thicknesses of the first silicon oxide layer 22, the silicon layer 24, and the second silicon oxide layer 26 in the second embodiment may be identical to or different from the first silicon oxide layer 12, the silicon layer 14, and the second silicon oxide layer 16, respectively, the average thicknesses are preferably identical from the perspective of reducing the distortion of the base member 8 due to the layer stresses of the light reflecting layers 10 and 20.

Operational Effect

According to the second embodiment, the same effects as those of the first embodiment are achieved. In addition, the following effects are also achieved.

Typically, in the case where a three-layer light reflecting layer is formed on one surface of the base member, the stress of the stacked layer often causes problems. The thickness of the base member is of the order of 100 μm in a gear such as the escape gear wheel part, and as such, in the case where the light reflecting layer is formed on only one surface of the gear, the gear may distort due to the stress of the light reflecting layer.

In contrast, since the light reflecting layers 10 and 20 having the three-layer structures are provided on the first surface 8A and the second surface 8B, the escape gear wheel part 200 of the second embodiment reduces the distortion of the base member 8 due to the layer stresses of the light reflecting layers 10 and 20. Further, the second silicon oxide layers 16 and 26 provided at the outermost layer enhance the protective property of each of the first surface 8A and the second surface 8B of the base member 8. As a result, the escape gear wheel part 200 with more excellent durability is achieved.

Further, in the case where the escape gear wheel part 200 is mounted in the mechanical watch 1 having a see-through structure such as that illustrated in FIGS. 1 and 2, the escape gear wheel part 200 is visible from both the case back side and the dial side, and thus the decorativeness of the mechanical watch 1 can be further improved. In other words, the escape gear wheel part 200 of the second embodiment is effective in enhancing the decorativeness of the mechanical watch 1.

Method for manufacturing Escape Gear Wheel Part of Second Embodiment

The method for manufacturing the escape gear wheel part 200 of the second embodiment is the same as the manufacturing method of the first embodiment except that a step of forming the light reflecting layer 20 is further provided in addition to the manufacturing method of the first embodiment. The light reflecting layer 20 can be formed in the same manner as the light reflecting layer 10 in the first embodiment.

The escape gear wheel part 200 of the second embodiment is preferably manufactured by simultaneously forming the first silicon oxide layers 12 and 22 on the first surface 8A and the second surface 8B of the base member 8, and then simultaneously forming the silicon layers 14 and 24, and then, simultaneously forming the second silicon oxide layers 16 and 26.

Examples of the simultaneous forming method include a method the layers of the light reflecting layers 10 and 20 are simultaneously formed while only the outer periphery of the base member 8 is placed on a boat in a vertical or horizontal furnace.

By simultaneously forming the layers, the average thicknesses of the first silicon oxide layers 12 and 22, the silicon layers 14 and 24, and the second silicon oxide layers 16 and 26 are set to substantially the same average thickness, and thus the escape gear wheel part 200 that suppresses the distortion of the base member 8 due to the layer stress of the light reflecting layers 10 and 20 is obtained.

Here, since the escape gear wheel part 200 using the base member 8 made of silicon tends to be brittle in comparison with an escape gear wheel part using a metal base member, and therefore it is generally difficult to form the light reflecting layers 10 and 20 on the first surface 8A and the second surface 8B of the base member 8 in terms of device conveyance and handleability.

In view of this, when a vertical or horizontal furnace is used to form the light reflecting layers 10 and 20, the base member 8 can be set by hand insertion, and therefore, even when the base member 8 is brittle, each of the first silicon oxide layers 12 and 22, the silicon layers 14 and 24, and the second silicon oxide layers 16 and 26 can be formed on the first surface 8A and the second surface 8B of the base member 8 in a single formation. In addition, this method can reduce the number of steps by one-half.

Note that when simultaneously forming the layers, at least one of the first silicon oxide layers 12 and 22 and the second silicon oxide layers 16 and 26 is preferably formed by a thermal oxidation method, and the silicon layers 14 and 24 is preferably formed by a low-pressure CVD method.

Third Embodiment

Regarding a third embodiment, differences from the second embodiment are mainly described, and overlapping descriptions are omitted.

An escape gear wheel part according to the third embodiment is the same as the escape gear wheel part 200 according to the second embodiment except that a light reflecting layer having a three-layer structure in which a first silicon oxide layer, a silicon layer, and a second silicon oxide layer are layered in this order on the side surface where the first surface and the second surface of the base member are coupled.

Figure 6:
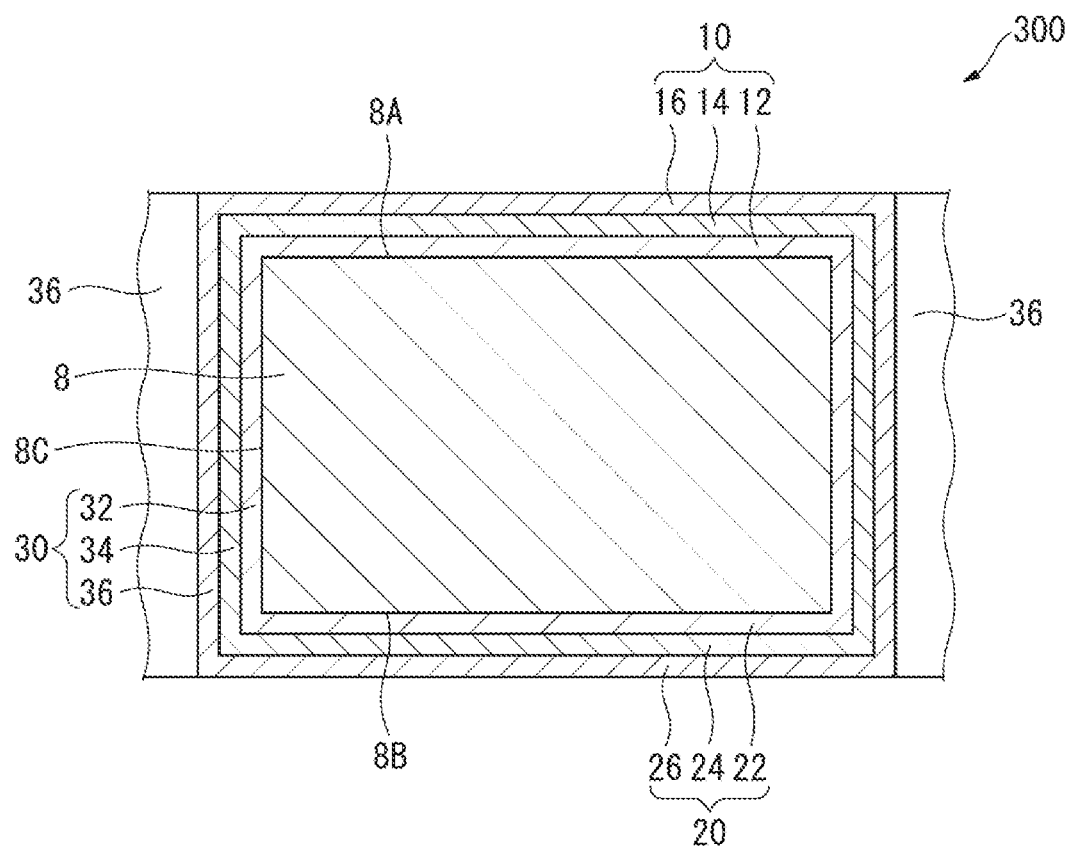
FIG. 6 is a partial cross-sectional view of the escape gear wheel part according to the third embodiment, and specifically is a partial cross-sectional view taken along the line A-A on the assumption that a light reflecting layer is also provided on a second surface and a side surface of a base member in the escape gear wheel part illustrated in FIG. 3.

FIG. 6 is a partial cross-sectional view of an escape gear wheel part 300 according to the third embodiment, and specifically is a partial cross-sectional view taken along the line A-A on the assumption that the light reflecting layer 10 is provided also on the second surface 8B and a side surface 8C of the base member 8 in the escape gear wheel part 100 illustrated in FIG. 3.

As illustrated in FIG. 6, the escape gear wheel part 300 includes the light reflecting layers 10, 20 and 30 having a three-layer structures in which first silicon oxide layers 12, 22 and 32, silicon layers 14, 24 and 34, and second silicon oxide layers 16, 26 and 36 are layered in this order on the first surface 8A, the second surface 8B, and the side surface 8C of the base member 8.

Operational Effect

According to the third embodiment, the same effects as those of the second embodiment are achieved. In addition, the following effects are also achieved.

Since the light reflecting layers 10, 20 and 30 are provided on the first surface 8A, the second surface 8B, and the side surface 8C of the base member 8, or in other words, the light reflecting layers 10, 20 and 30 are provided on the entire surface of the base member 8, the distortion of the base member 8 is further suppressed and the protective property of the base member 8 in its entirety is enhanced. As a result, the escape gear wheel part 300 with more excellent durability is achieved.

In particular, in a gear, such as the escape gear wheel part 300, having a portion that makes contact with other parts, the contact portion is protected by the light reflecting layer 30 covering the side surface 8C of the base member 8, and thus the breaking resistance of the gear can be improved.

Method for Manufacturing Watch Component of Third Embodiment

The method for manufacturing the escape gear wheel part 300 of the third embodiment is the same as the manufacturing method of the second embodiment except that a step of forming the light reflecting layer 30 is further provided in addition to the manufacturing method of the second embodiment. The light reflecting layer 30 can be formed in the same manner as the light reflecting layer 10 in the first embodiment.

The escape gear wheel part 300 of the third embodiment is preferably manufactured by simultaneously forming the first silicon oxide layers 12, 22 and 32 on the first surface 8A, the second surface 8B, and the side surface 8C of the base member 8, and then simultaneously forming the silicon layers 14, 24 and 34, and then, simultaneously forming the second silicon oxide layers 16, 26 and 36.

Examples of the simultaneous forming method include a method in which the layers of the light reflecting layers 10, 20 and 30 are simultaneously formed while only the outer periphery of the base member 8 is placed on a boat in a vertical or horizontal furnace in the same manner as the second embodiment.

By simultaneously forming the layers, the average thicknesses of the first silicon oxide layers 12, 22 and 32, the silicon layers 14, 24 and 34, and the second silicon oxide layers 16, 26 and 36 are set to substantially the same average thickness, and thus the escape gear wheel part 300 that suppresses the distortion of the base member 8 due to the layer stress of the light reflecting layers 10, 20 and 30 is obtained.

Note that when simultaneously forming the layers, at least one of the first silicon oxide layers 12, 22 and 32 and the second silicon oxide layers 16, 26 and 36 is preferably formed by a thermal oxidation method, and the silicon layers 14 and 24, 36 is preferably formed by a low-pressure CVD method.

Other Embodiments

The present disclosure is not limited to the above-mentioned embodiments, and variations, modifications, and the like may be made insofar as they are within the scope in which the object of the present disclosure can be achieved.

While the escape gear wheel part 100 as a watch component and the mechanical watch 1 provided with the escape gear wheel part 100 are described in the above-described embodiments, the present disclosure is not limited thereto.

For example, it suffices that the mechanical watch 1 according to the first embodiment is provided with at least one watch component of the present disclosure.

The escape gear wheel part 100 according to the above-described embodiments may have an antistatic layer or a soil-resistant layer having transparency at the outermost layer to the extent that the decorativeness is not impaired. Thus, a soil-resistant function or an antistatic function is provided to the escape gear wheel part 100.

In addition, in the method for manufacturing the escape gear wheel part 100 according to the above-described embodiments, any desired step can be added as necessary. For example, an intermediate process such as washing may be performed between each step. In addition, after forming the second silicon oxide layer, a step of forming a soil-resistant layer or a step of forming an anti-static layer may be performed. A preprocess such as cutting, grinding, polishing, and honing may be provided to the base member.

Watch Movement

The watch movement according to this embodiment includes at least one of the watch components according to the above-described embodiments. According to this embodiment, a watch movement with excellent decorativeness and high design property is achieved.

Watch

The watch according to this embodiment includes at least one of the watch components according to the above-described embodiments.

According to the watch according to this embodiment, a watch with excellent decorativeness and excellent design is achieved.

The watch is not limited, and examples of the watch include a quartz watch, a mechanical watch, and an electronically controlled mechanical watch. Among them, from the perspective of presenting more decorativeness of the watch component, it is preferable that the watch be a mechanical watch with a see-through structure.

EXAMPLES

While the present disclosure is described in more detail below with Examples, the present disclosure is not limited to the following Examples insofar as the spirit of the present disclosure is not exceeded.

Relationship Between Thickness and Gradation of Silicon Oxide Layer

With a structure in which one silicon oxide layer is formed on a silicon base member, the relationship between the thickness of the silicon oxide layer and the gradation was determined through optical calculation. This structure is a known structure. The optical calculation is described in detail.

First, the reflection spectrum with a change in thickness of the first silicon oxide layer was determined by calculation using the refractive index n and the extinction coefficient k of each of the silicon base member and the first silicon oxide layer at a wavelength from 400 nm to 800 nm.

Figure 7:
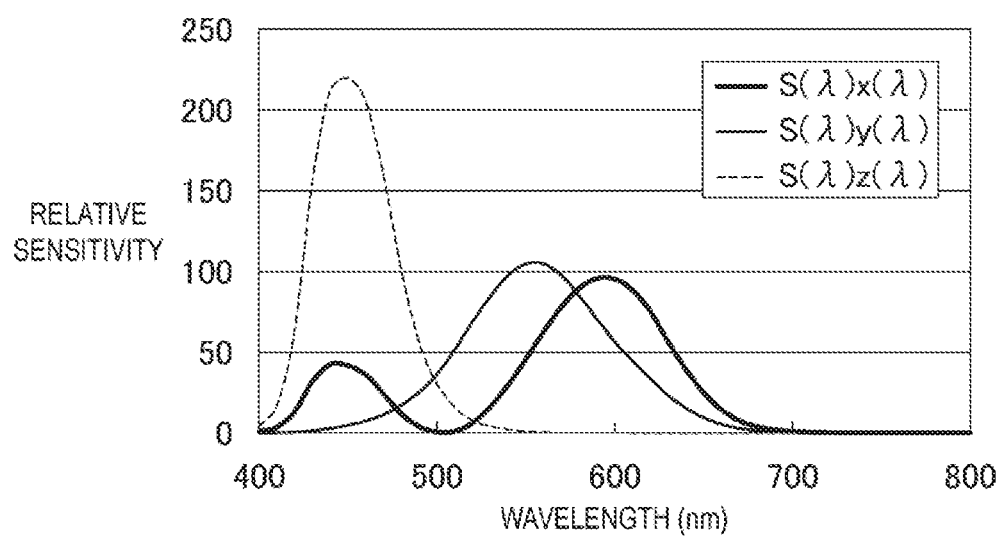
FIG. 7 is a graph of a color-matching function.

Next, the reflectance R (λ) and the color-matching function illustrated in FIG. 7 were converted to the three stimulus values XYZ by using the following Equations (1A) to (1C) and Equation (2), and then converted to RGB values of a 256-level gradation by using the following Equation (3) and Equations (4A) to (4C).

Thus, the reflection spectrum was converted to RGB values. No γ correction was performed, and γ=1 was used.

A graph of the relationship between the thickness of the silicon oxide layer and the gradation was created based on the RGB value. The created graph is illustrated in FIG. 8.

Figure 8:
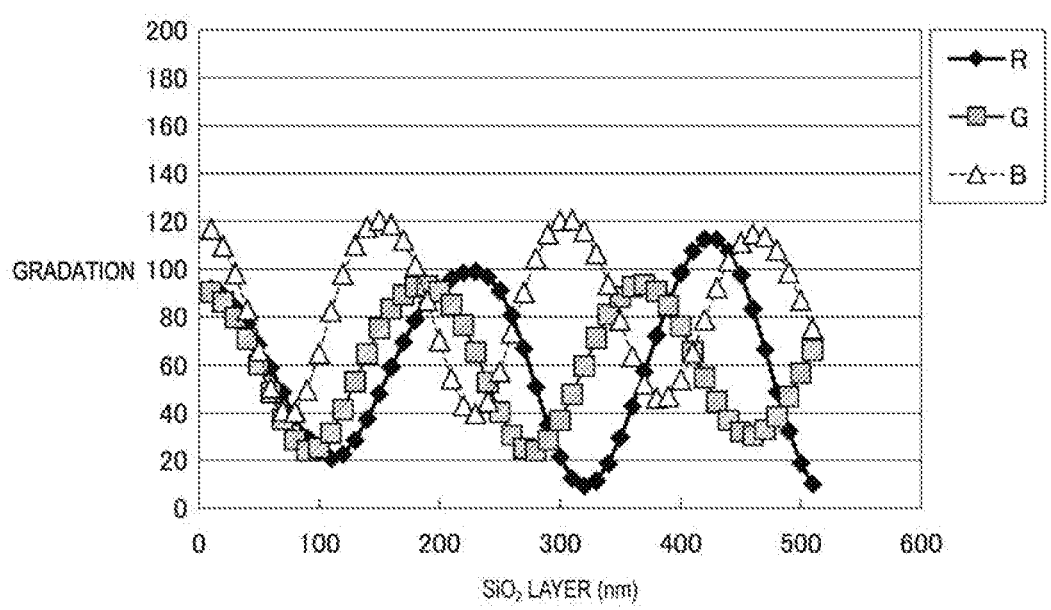
FIG. 8 is a graph of a relationship between the thickness and the gradation of a silicon oxide layer when one silicon oxide layer is formed on a silicon base member.

It is shown from FIG. 8 that, in the case where one silicon oxide layer is formed on the silicon base member, the gradation is raised only to approximately 120 in each of R, G, and B even when the thickness of the silicon oxide layer is changed. This indicates that the silicon oxide layer itself has low reflectance and insufficient coloring.

[Equation 1]

$$X = K \int_{380}^{780} S(\lambda)\bar{x}(\lambda)R(\lambda)d\lambda \quad \text{Equation (1A)}$$

$$Y = K \int_{380}^{780} S(\lambda)\bar{y}(\lambda)R(\lambda)d\lambda \quad \text{Equation (1B)}$$

$$Z = K \int_{380}^{780} S(\lambda)\bar{z}(\lambda)R(\lambda)d\lambda \quad \text{Equation (1C)}$$

K: Coefficient

S(λ): Spectral Fraction Of Light Source $\bar{x}(\lambda)$, $\bar{y}(\lambda)$, $\bar{z}(\lambda)$: Color-Matching Function R(λ): Reflectance

[Equation 2]

$$K = \frac{100}{\int_{380}^{780} S(\lambda)\bar{y}(\lambda)d\lambda} \quad \text{Equation (2)}$$

[Equation 3]

$$\begin{pmatrix} R' \\ G' \\ B' \end{pmatrix} = \begin{pmatrix} 3.241 & -1.537 & -0.4986 \\ -0.9692 & 1.876 & 0.0416 \\ 0.0556 & -0.2040 & 1.051 \end{pmatrix} \begin{pmatrix} X \\ Y \\ Z \end{pmatrix} \quad \text{Equation (3)}$$

[Equation 4]

$$R = \frac{R'}{100} \times 255 \quad \text{Equation (4A)}$$

$$G = \frac{G'}{100} \times 255 \quad \text{Equation (4B)}$$

$$B = \frac{B'}{99.29} \times 255 \quad \text{Equation (4C)}$$

Through the above-described optical calculation, the coloring of the following watch components 1 to 4 was evaluated.

In the following description, a silicon base member may be referred to as an "Si base member", a first silicon oxide layer as a "first SiO₂ layer", a silicon layer as an "Si layer", and a second silicon oxide layer as a "second SiO₂ layer".

Example 1

A laminate in which a light reflecting layer including a first silicon oxide layer of 220 nm, a silicon layer of 76 nm, and a second silicon oxide layer of 140 nm is formed on the silicon base member was used as the watch component 1.

An overview of the configuration of the watch component 1 is as follows.

Si base member/first SiO₂ layer (220 nm)/Si layer (76 nm)/second SiO₂ layer (140 nm)

With the watch component 1, the observation angle was changed to 0°, 15°, 30° and 45°, and the reflection spectrum was determined for each observation angle. In addition, the determined reflection spectrum was converted to an RGB value of the 256-level gradation in the above-described method.

Figure 9:
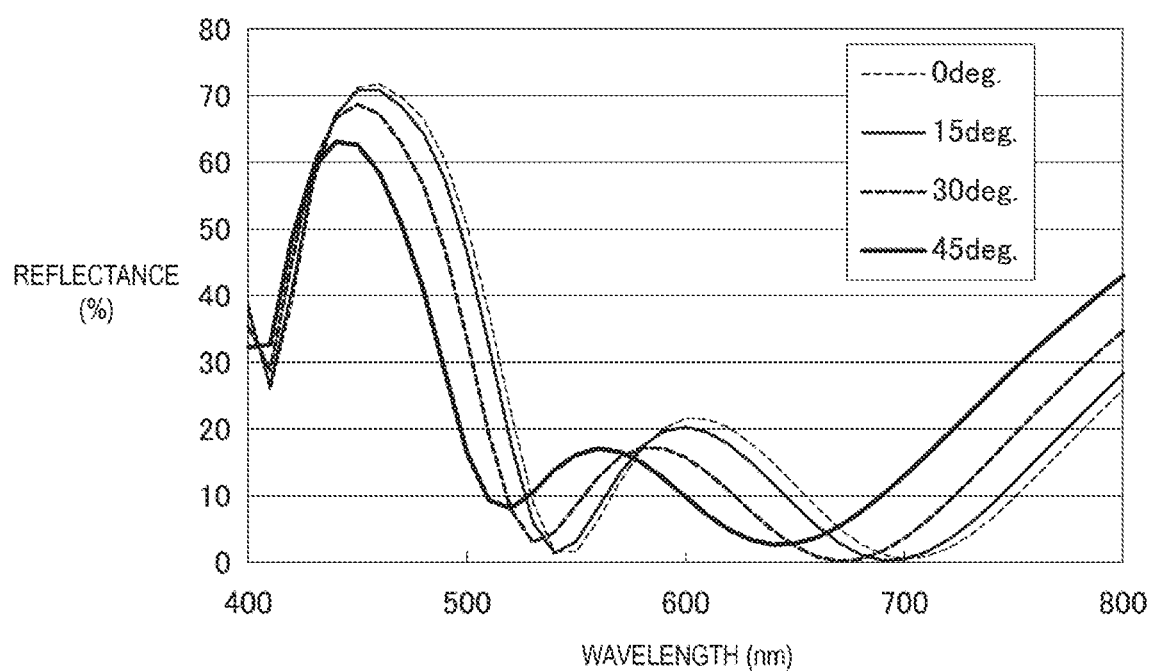
FIG. 9 is a graph of a relationship between the wavelength and the reflectance of a watch component 1 of Example 1.

Specifically, the reflection spectrum in the case where the thicknesses of the first SiO₂ layer, the Si layer, and the second SiO₂ layer were changed was calculated using the refractive index n and the extinction coefficient k of each of the Si base member, the first SiO₂ layer, the Si layer, and the second SiO₂ layer at a wavelength from 400 nm to 800 nm (see FIG. 9). Subsequently, the reflection spectrum was converted to an RGB gradation of the 256-level gradation in a manner similar to the above-described method.

FIG. 9 is a graph of the relationship between the wavelength and the reflectance of the watch component 1.

It is shown from FIG. 9 that a reflectance of 70% at maximum is indicated in a blue region of a wavelength from 400 nm to 550 nm, and that the reflectance can be limited to approximately 20% in a wavelength region of approximately from 550 nm to 750 nm.

Figure 10:
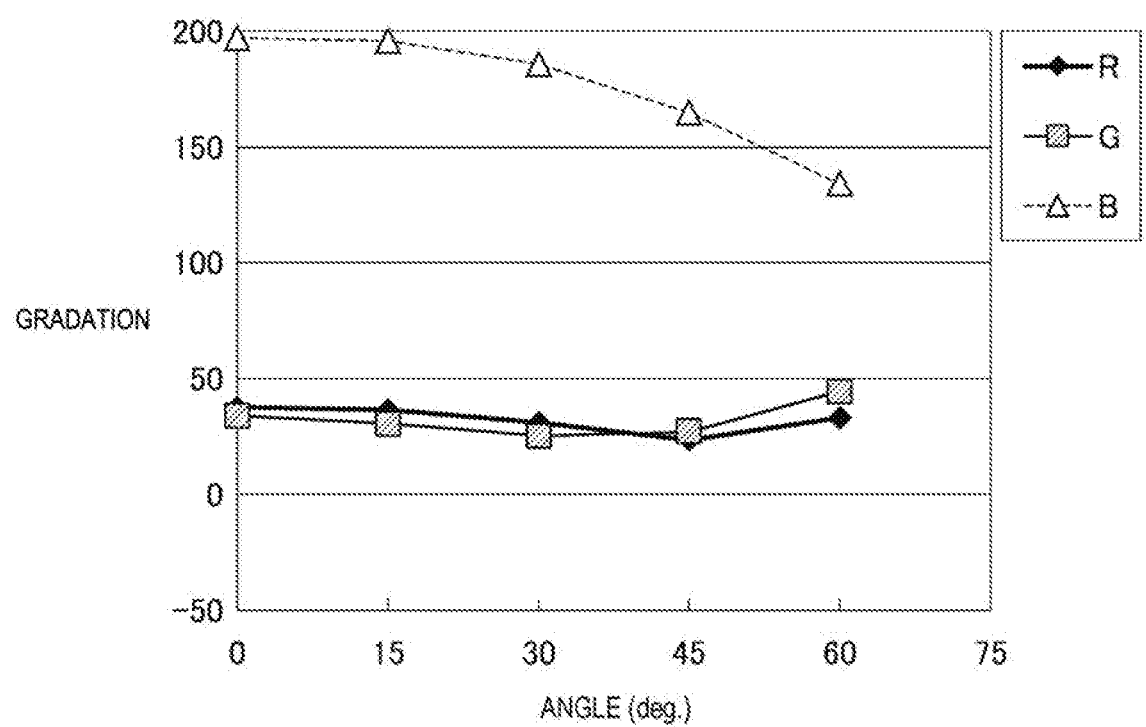
FIG. 10 is a graph of a relationship between the observation angle and the gradation of the watch component 1 of Example 1.
Figure 11A:
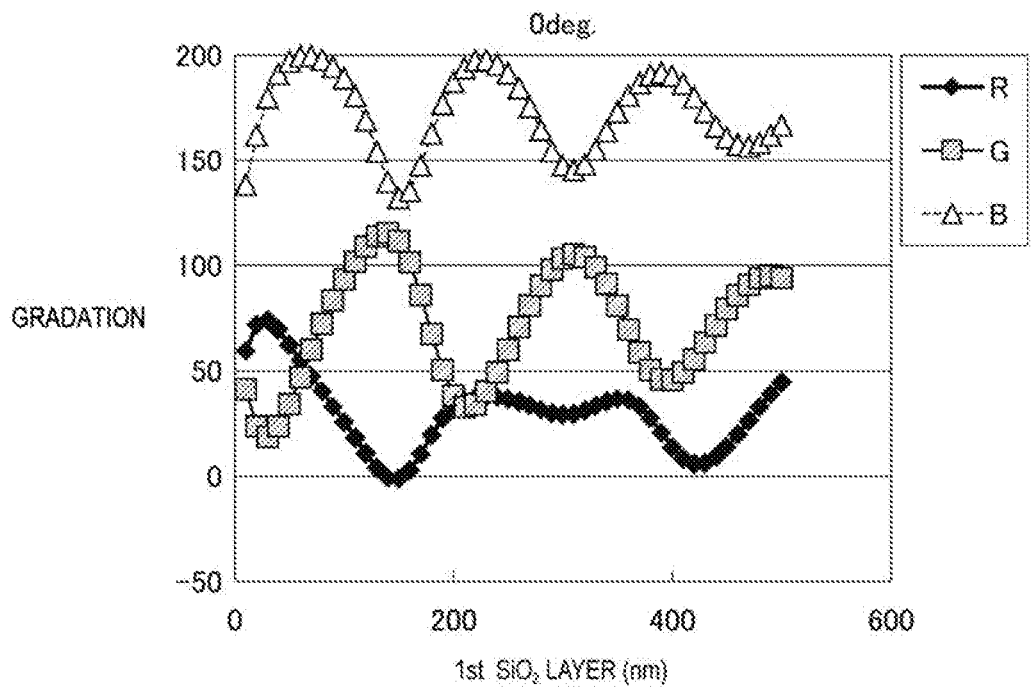
FIG. 11A is a graph of a relationship between the gradation and the thickness of a first silicon oxide layer at an observation angle of 0° in a watch component 2 of Example 2.
Figure 11B:
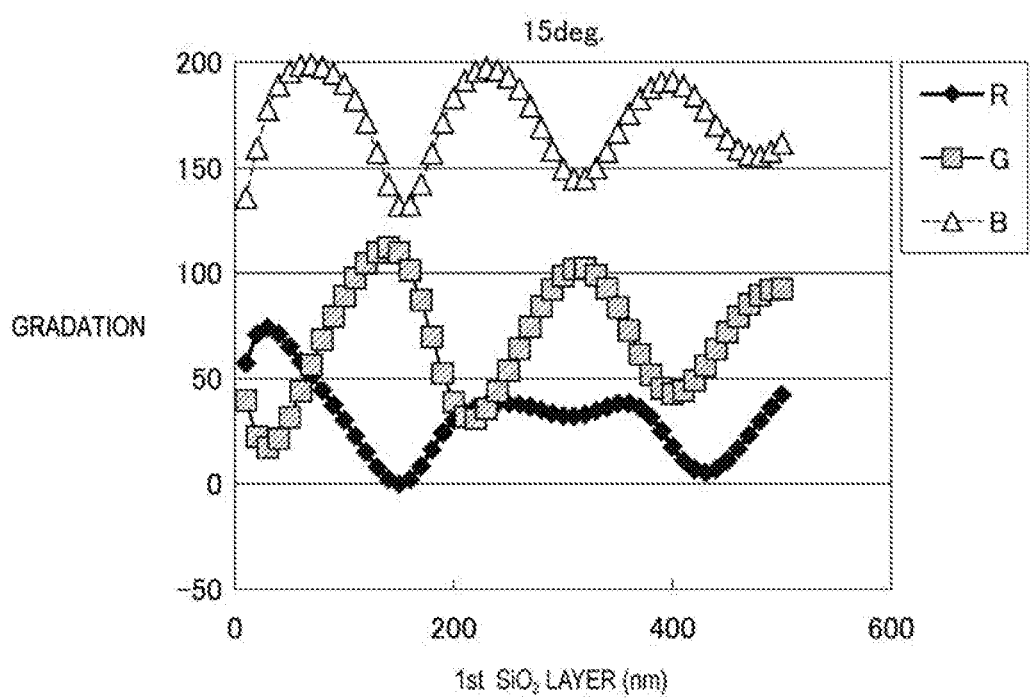
FIG. 11B is a graph of a relationship between the gradation and the thickness of the first silicon oxide layer at an observation angle of 15° in the watch component 2 of Example 2.
Figure 11C:
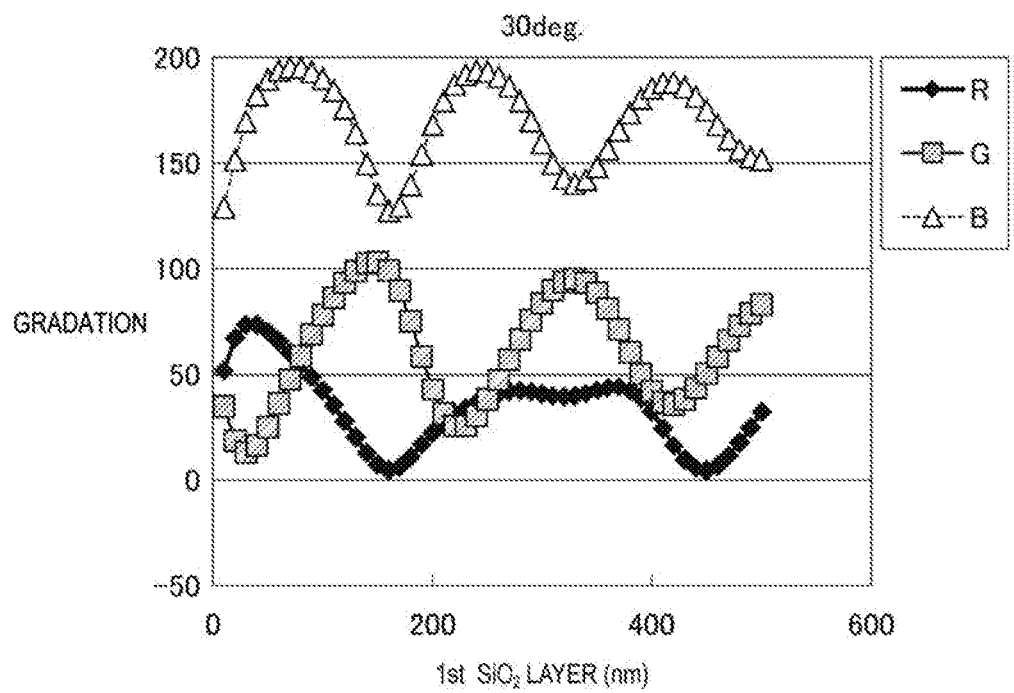
FIG. 11C is a graph of a relationship between the gradation and the thickness of the first silicon oxide layer at an observation angle of 30° in the watch component 2 of Example 2.
Figure 11D:
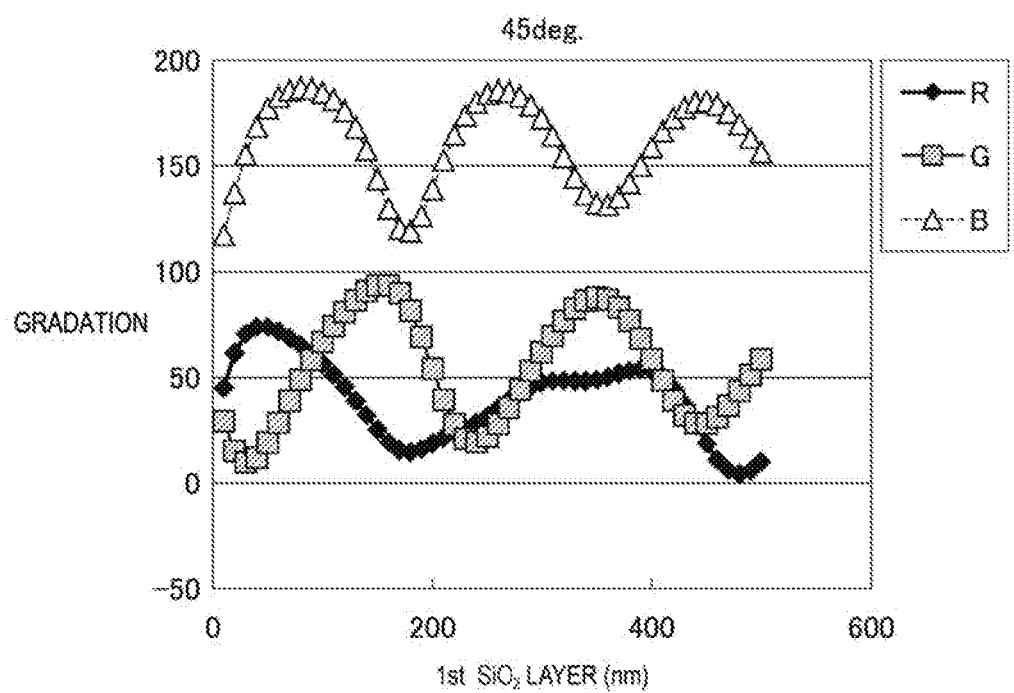
FIG. 11D is a graph of a relationship between the gradation and the thickness of the first silicon oxide layer at an observation angle of 45° in the watch component 2 of Example 2.
Figure 12A:
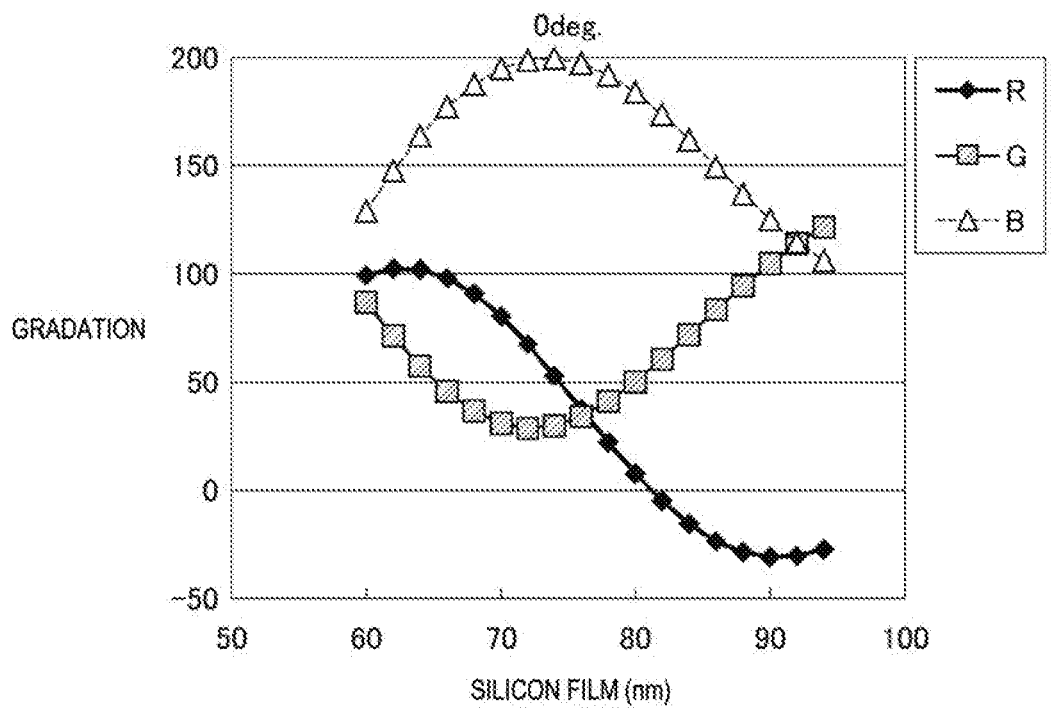
FIG. 12A is a graph of a relationship between the gradation and the thickness of a silicon layer at an observation angle of 0° in a watch component 3 of Example 3.
Figure 12B:
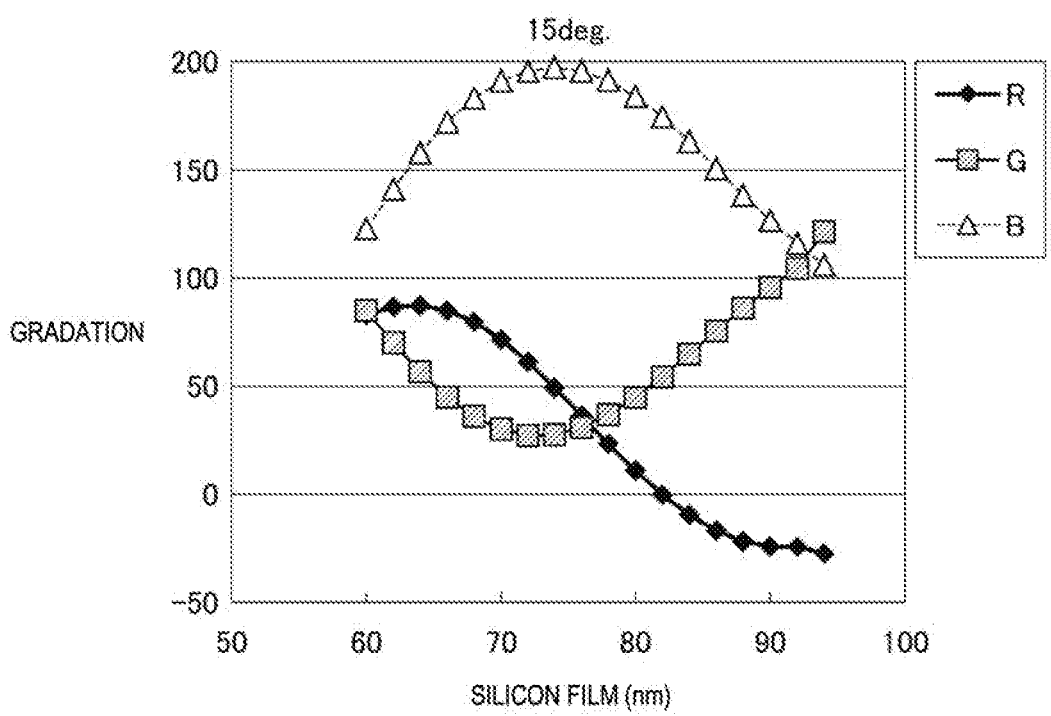
FIG. 12B is a graph of a relationship between the gradation and the thickness of the silicon layer at an observation angle of 15° in the watch component 3 of Example 3.
Figure 12C:
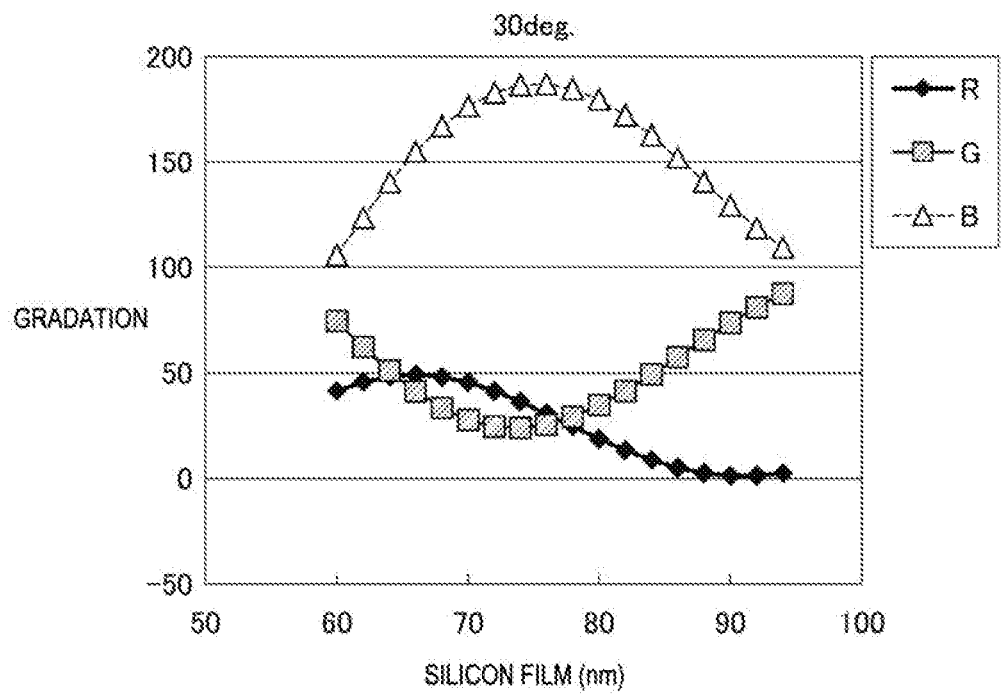
FIG. 12C is a graph of a relationship between the gradation and the thickness of the silicon layer at an observation angle of 30° in the watch component 3 of Example 3.
Figure 12D:
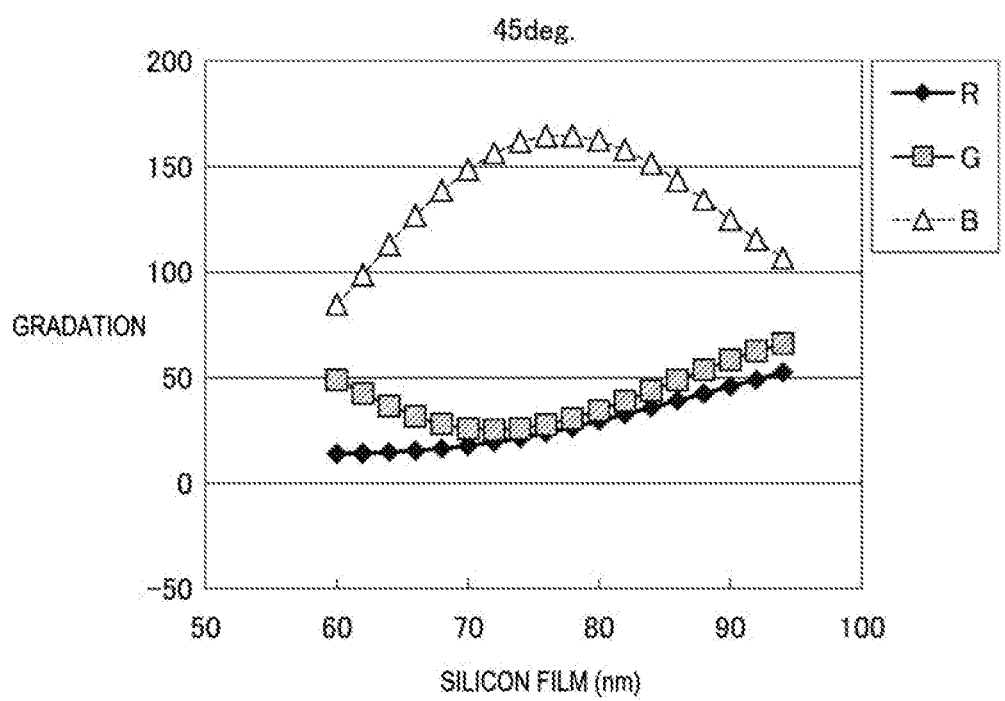
FIG. 12D is a graph of a relationship between the gradation and the thickness of the silicon layer at an observation angle of 45° in the watch component 3 of Example 3.
Figure 13A:
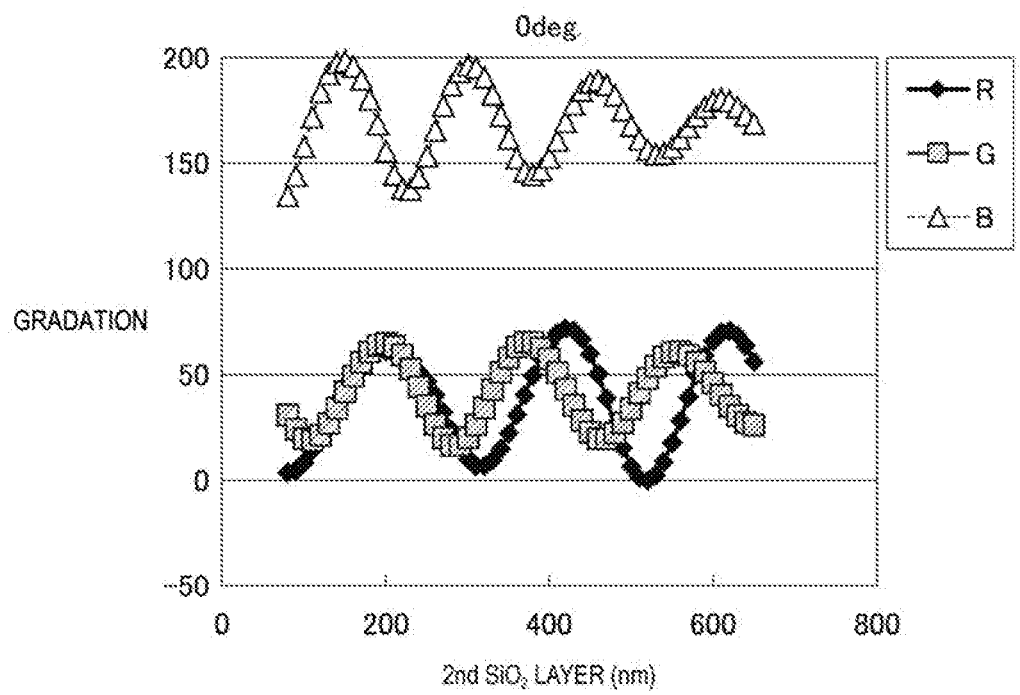
FIG. 13A is a graph of a relationship between the gradation and the thickness of a second silicon oxide layer at an observation angle of 0° in a watch component 4 of Example 4.
Figure 13B:
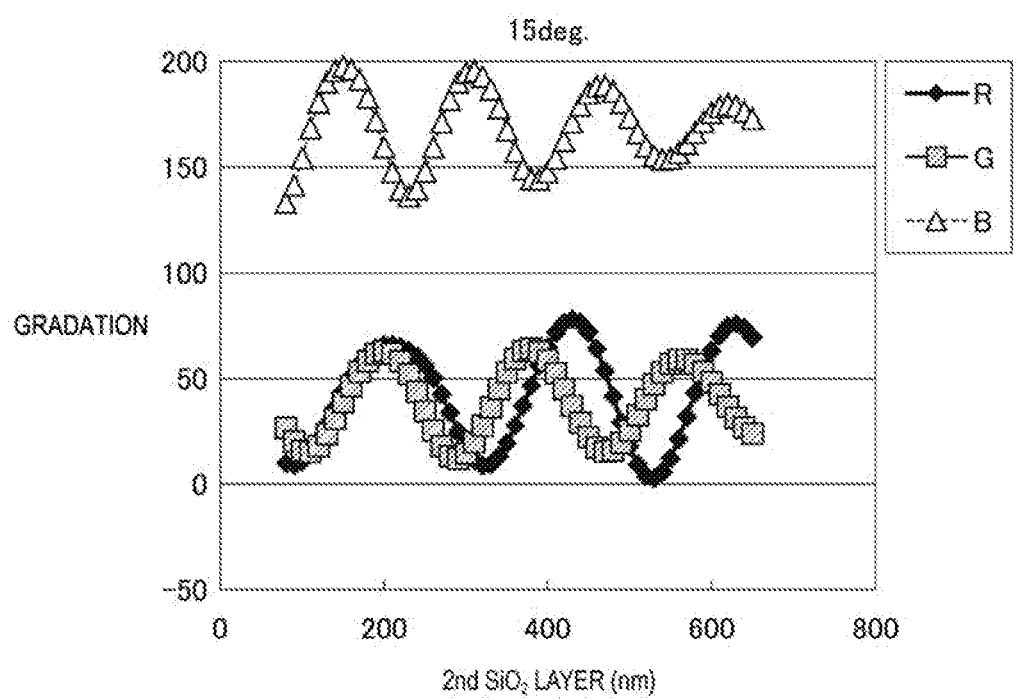
FIG. 13B is a graph of a relationship between the gradation and the thickness of the second silicon oxide layer at an observation angle of 15° in the watch component 4 of Example 4.
Figure 13C:
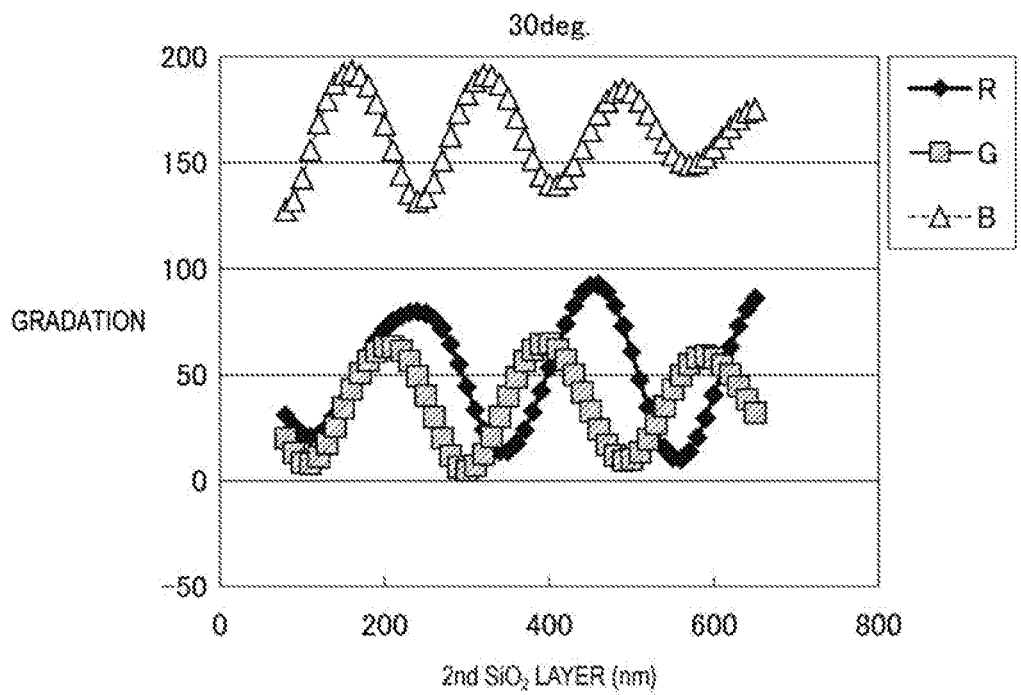
FIG. 13C is a graph of a relationship between the gradation and the thickness of the second silicon oxide layer at an observation angle of 30° in the watch component 4 of Example 4.
Figure 13D:
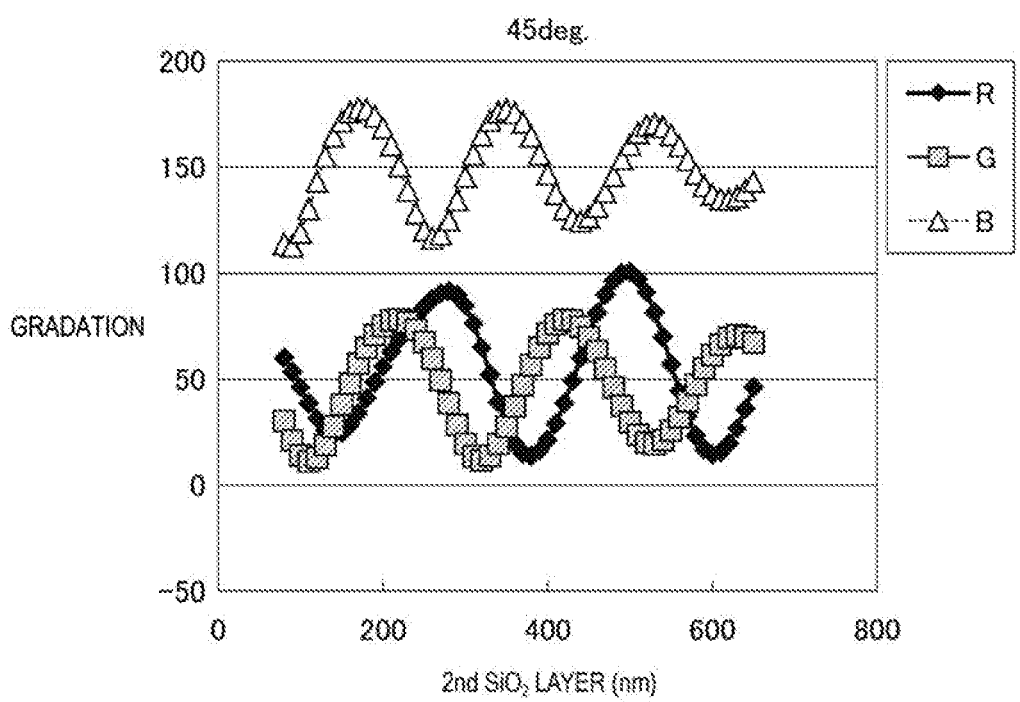
FIG. 13D is a graph of a relationship between the gradation and the thickness of the second silicon oxide layer at an observation angle of 45° in the watch component 4 of Example 4.

FIG. 10 illustrates the relationship between the observation angle and the gradation of the watch component 1.

It is shown from FIG. 10 that B was increased to approximately 200 gradation level. In addition, it is shown that G and R were at 50 gradation level or lower.

In addition, it is shown that, regarding the dependency of the observation angle, B stayed at 150 gradation level or higher until the angle exceeds 45°.

Therefore, with the watch component 1, favorable coloring with blue can be achieved in comparison with the configuration of a known watch component in which one silicon oxide layer is formed on the silicon base member.

Further, with the watch component 1, favorable coloring with blue can be achieved even when the observation angle is changed.

Example 2

A laminate that is the same as the laminate of the watch component 1 except that the thickness of the first silicon oxide layer was changed by 10 nm for each time in the range from 10 nm to 500 nm was used. These multiple laminates are collectively referred to as a watch component 2.

An operation was performed on the watch component 2 in the same manner as the watch component 1.

An overview of the configuration of the watch component 2 is as follows.

Si Base member/first SiO₂ layer (from 10 nm to 500 nm)/Si layer (76 nm)/second SiO₂ layer (140 nm)

FIGS. 11A to 11D are graphs of the relationship between the thickness of the first silicon oxide layer and the gradation at observation angles of 0°, 15°, 30° and 45° in the watch component 2.

It is shown from FIGS. 11A to 11D that the gradation cyclically varies in each of R, G and B depending on the thickness of the first silicon oxide layer.

For example, to achieve coloring in blue color, it is desirable to set B at 150 gradation level or higher and G and R at 100 gradation level or lower, and therefore, it is shown from FIGS. 11A to 11D that the thickness of the first silicon oxide layer is preferably from 20 nm to 100 nm, or from 180 to 290 nm, or, from 330 nm to 500 nm. In particular, at or around 220 nm, there is a region where B indicates a high gradation level and G and R indicate low gradation levels, and accordingly it is shown that the thickness of the first silicon oxide layer is more preferably from 210 nm to 280 nm.

Example 3

A laminate that is the same as the laminate of the watch component 1 except that the thickness of the silicon layer was changed by 2 nm for each time in the range from 60 nm to 94 nm was used. These multiple laminates are collectively referred to as a watch component 3.

An operation was performed on the watch component 3 in the same manner as the watch component 1.

An overview of the configuration of the watch component 3 is as follows.

Si Base member/first $SiO_2$ layer (220 nm)/Si layer (from 60 nm to 94 nm)/second $SiO_2$ layer (140 nm)

FIGS. 12A to 12D are graphs of the relationship between the thickness of the silicon layer and the gradation at observation angles of 0°, 15°, 30° and 45° in the watch component 3.

For example, to achieve coloring in blue color, it is desirable to set B at 150 gradation level or higher and G and R at 100 gradation level or lower, and it is shown from FIGS. 12A to 12D that the thickness of the silicon layer is preferably from 66 nm to 86 nm. Further, also considering the observation angle of 45°, it is shown that the thickness of the silicon layer is more preferably from 70 nm to 84 nm.

Example 4

A laminate that is the same as the laminate of the watch component 1 except that the thickness of the second silicon oxide layer was changed by 10 nm for each time in a range from 80 nm to 650 nm was used. These multiple laminates are collectively referred to as a watch component 4.

An operation was performed on the watch component 4 in the same manner as the watch component 1.

An overview of the configuration of the watch component 4 is as follows.

Si Base member/first $SiO_2$ layer (220 nm)/Si layer (76 nm)/second $SiO_2$ layer (from 80 nm to 650 nm)

FIGS. 13A to 13D are graphs of the relationship between the thickness of the second silicon oxide layer and the gradation at observation angles of 0°, 15°, 30° and 45° in the watch component 4.

It is shown from FIGS. 13A to 13D that the gradation cyclically varies in each of R, G and B depending on the thickness of the second silicon oxide layer.

For example, to achieve coloring in blue color, it is desirable to set B at 150 gradation level or higher and G and R at 100 gradation level or lower, and accordingly it is shown from FIGS. 13A to 13D that the thickness of the second silicon oxide layer is preferably from 100 nm to 200 nm, or from 250 nm to 360 nm, or, from 400 nm to 550 nm. Further, also considering the observation angle of 45°, it is shown that the thickness of the second silicon oxide layer is more preferably from 130 nm to 200 nm, or from 310 nm to 360 nm.

Example 5

A laminate in which a light reflecting layer including a first silicon oxide layer of 150 nm, a silicon layer of 110 nm, and a second silicon oxide layer of 70 nm are formed on a silicon base member was used as a watch component 5.

An operation was performed on the watch component 5 in the same manner as the watch component 1.

An overview of the configuration of the watch component 5 is as follows.

Si base member/first $SiO_2$ layer (150 nm)/Si layer (110 nm)/second $SiO_2$ layer (70 nm)

Figure 14:
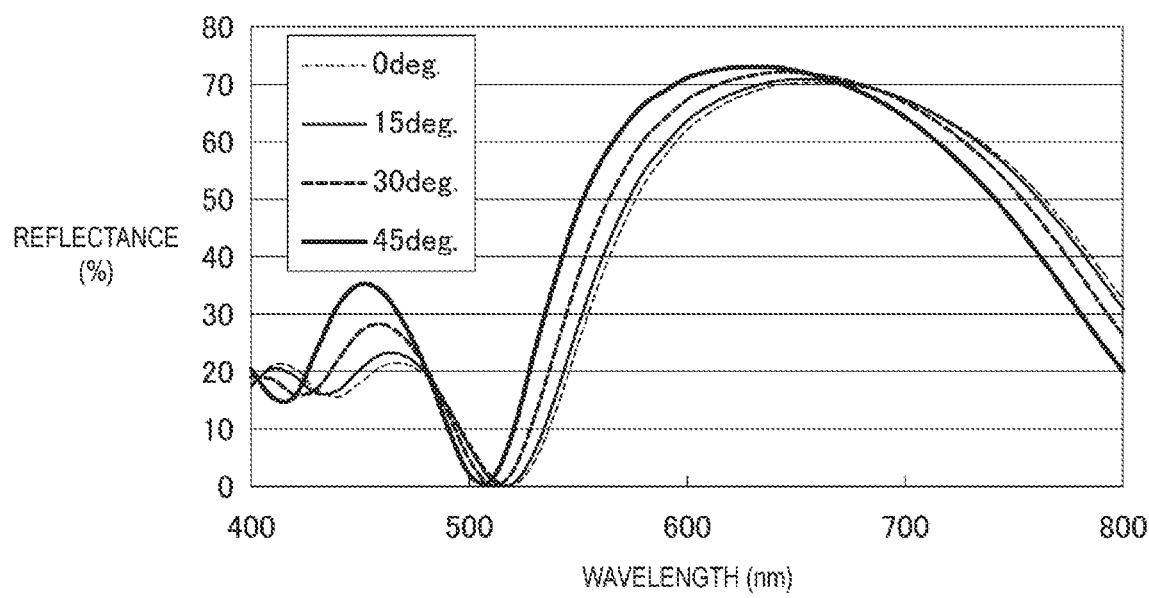
FIG. 14 is a graph of a relationship between the wavelength and the reflectance of a watch component 5 of Example 5.

FIG. 14 is a graph illustrating the relationship between the wavelength and the reflectance in the watch component 5.

In FIG. 14, a reflectance of 70% at maximum is indicated in a red region of a wavelength from 600 nm to 800.

Figure 15:
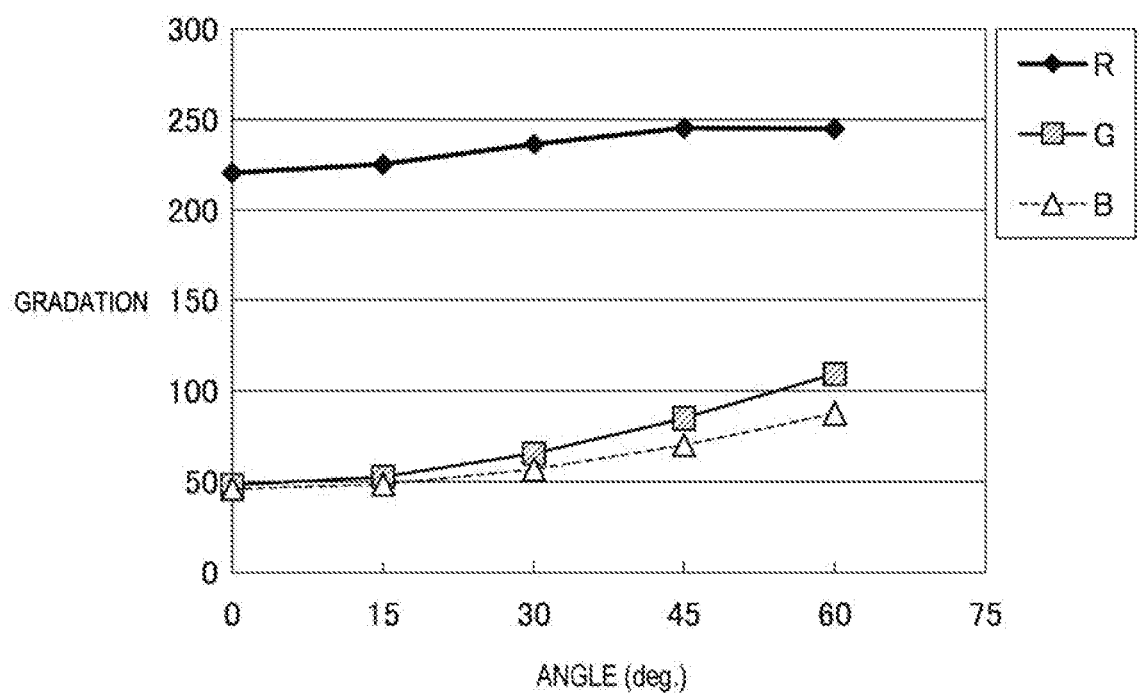
FIG. 15 is a graph of a relationship between the observation angle and the gradation of the watch component 5 of Example 5.

FIG. 15 illustrates the relationship between the observation angle and the gradation of the watch component 5.

It is shown from FIG. 15 that R was increased to approximately 250 gradation level, and B and G were at approximately 100 gradation or lower.

Thus, with the watch component 5, favorable coloring with red can be achieved.

Example 6

A laminate in which a light reflecting layer including a first silicon oxide layer of 330 nm, a silicon layer of 76 nm, and a second silicon oxide layer of 140 nm are formed on a silicon base member was used as a watch component 6. Note that the watch component 6 is an example of the watch component 2.

An operation was performed on the watch component 6 in the same manner as the watch component 1.

An overview of the configuration of the watch component 6 is as follows.

Si base member/first $SiO_2$ layer (330 nm)/Si layer (76 nm)/second $SiO_2$ layer (140 nm)

Figure 16:
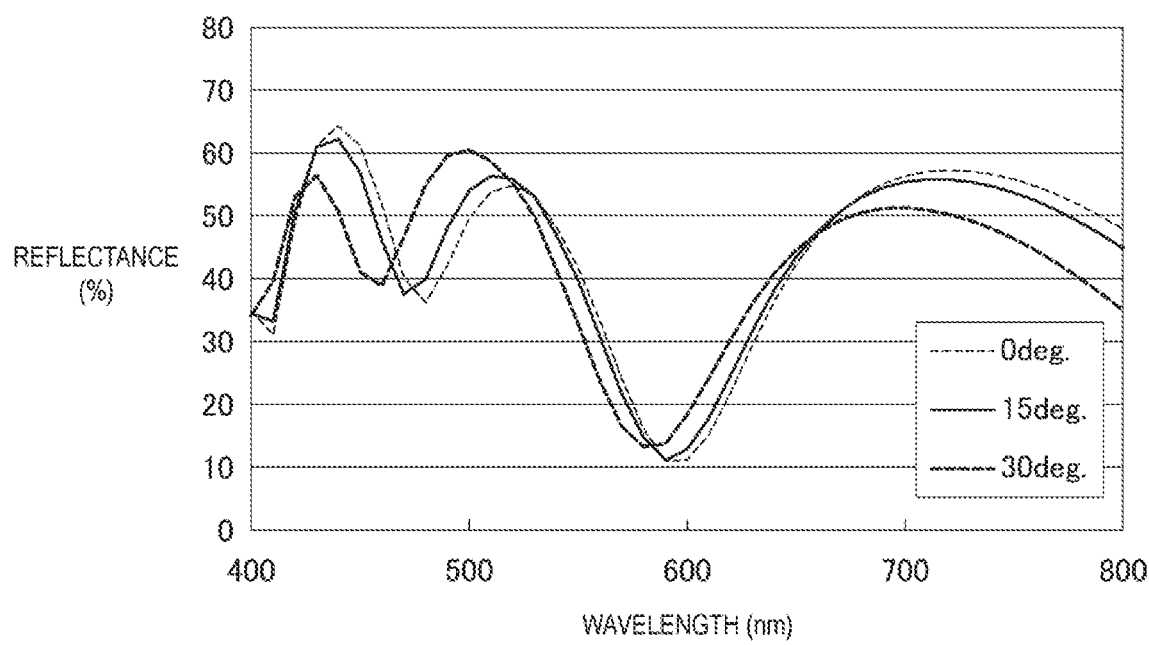
FIG. 16 is a graph of a relationship between the wavelength and the reflectance of a watch component 6 of Example 6.

FIG. 16 is a graph of the relationship between the wavelength and the reflectance of the watch component 6.

From FIG. 16, two peaks of a reflectance exceeding 50% at maximum were observed in a blue region of a wavelength from 400 nm to 550 nm and a green region of a wavelength from 400 nm to 600 nm.

Figure 17:
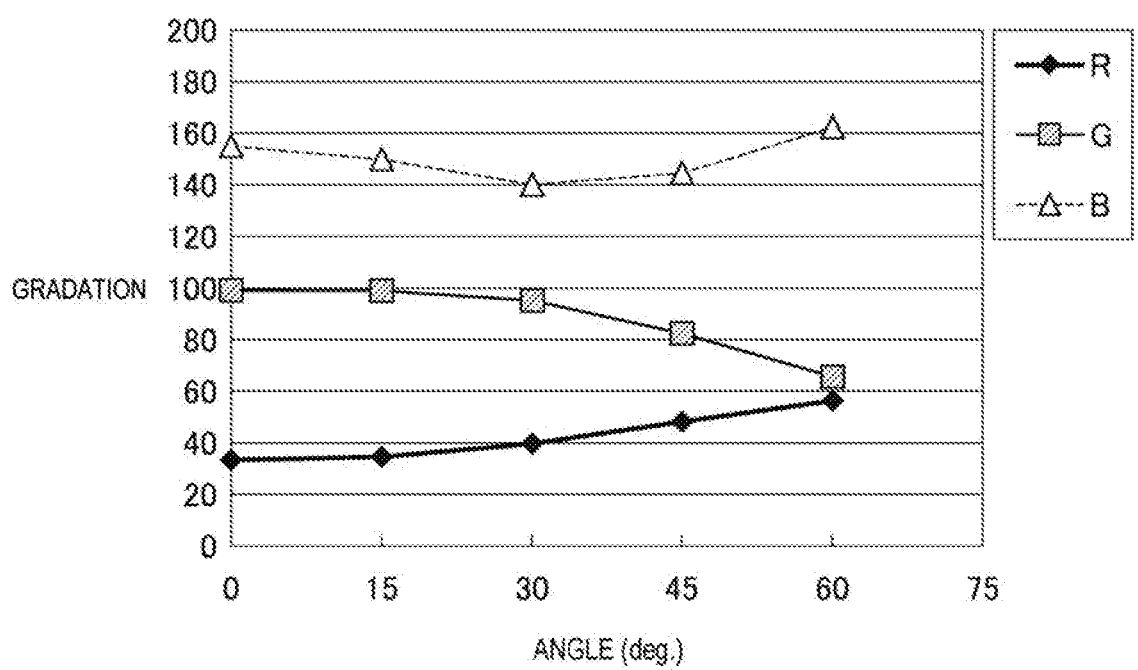
FIG. 17 is a graph of a relationship between the observation angle and the gradation of the watch component 6 of Example 6.

FIG. 17 illustrates the relationship between the observation angle and the gradation of the watch component 6.

It is shown from FIG. 17 that the gradation of B is highest, the gradation of G is next highest, and the gradation of R is 60 or lower.

Thus, with the watch component 6, favorable coloring with blue-green can be achieved.

Next, in order to verify the simulation results obtained through the above-described optical calculation, an escape gear wheel part similar to the escape gear wheel part illustrated in FIG. 3 was actually manufactured, and the coloring of the escape gear wheel part was evaluated.

Example 7

Production of Base Member of Escape Gear Wheel Part

A silicon wafer was prepared, and a photoresist was applied to one surface of the silicon wafer by a spin coating method while the back-surface mask material was disposed on the other surface, and, the photoresist and the back-surface mask material were cured.

The photoresist was then exposed by photolithography, followed by development to form a photoresist pattern corresponding to the planar outer shape of the base member of the escape gear wheel.

The silicon wafer was then etched with a photoresist pattern as a mask to form an outer shape of the base member of the escape gear wheel part including a projecting portion, an elastic portion, and a rim portion.

Next, the photoresist pattern and the back-surface mask material were removed, and thus a base member of an escape gear wheel part having a configuration similar to that of the base member of the escape gear wheel part illustrated in FIG. 3 was manufactured.

Production of Escape Gear Wheel Part

Step of Forming First $SiO_2$ Layer

The base member of the escape gear wheel part was placed in a vertical thermal oxidation furnace and held for 17 minutes after heating to 1050° C.

In this manner, a first $SiO_2$ layer having a thickness of 220 nm was formed on the entire surface, namely, the first surface, the second surface, and the side surface, of the base member, and thus a laminate 1 (base member/first $SiO_2$ layer (220 nm)) was obtained.

Step of Forming Si Layer

In a vertical low-pressure CVD furnace, the outer periphery of the laminate 1 (base member/first $SiO_2$ layer (220 nm)) was placed on a claw of a quartz boat. The furnace was depressurized with a dry pump and the base member was heated to 625° C. The monosilane gas was then fed for 19 minutes and 30 seconds.

In this manner, an Si layer having a thickness of 138 nm was formed on the entire surface of the first $SiO_2$ layer, and thus a laminate 2 (base member/first $SiO_2$ layer (220 nm)/Si layer (138 nm)) was obtained.

Step of Forming Second $SiO_2$ Layer

The laminate 2 (base member/first $SiO_2$ layer (220 nm)/Si layer (138 nm)) was placed in a vertical thermal oxidation furnace and held for 33 minutes after heating to 950° C.

In this manner, a second $SiO_2$ layer having a thickness of 140 nm was formed on the entire surface of the Si layer, and an escape gear wheel part having a configuration similar to that of the escape gear wheel part illustrated in FIG. 3 was obtained.

Note that the second $SiO_2$ layer was formed through thermal oxidation of the Si layer of the laminate 2.

When the Si layer is thermally oxidized to form the second $SiO_2$ layer, the Si layer of the laminate 2 is consumed by approximately 44.6%. Accordingly, the Si layer of the laminate 2 was consumed by approximately 62 nm so as to be 76 nm.

An overview of the configuration of the escape gear wheel part is as follows.

Base member/first $SiO_2$ layer (220 nm)/Si layer (76 nm)/second $SiO_2$ layer (140 nm)

Average Thicknesses of First Silicon Oxide Layer, Silicon Layer, and Second Silicon Oxide Layer The average thicknesses of the first silicon oxide layer, the silicon layer, and the second silicon oxide layer were measured by the above-described method.

As a result, it was confirmed that the average thicknesses of the first silicon oxide layer, the silicon layer, and the second silicon oxide layer measured by the above-described method match the thicknesses of the first silicon oxide layer, the silicon layer, and the second silicon oxide layer that were aimed in Example 7.

Evaluation of Coloring

The coloring of the escape gear wheel part manufactured in Example 7 was visually evaluated.

The escape gear wheel part exhibited a blue color with favorable coloring at each of the observation angles of 0°, 15°, 30° and 45°.

Thus, it was verified that the simulation results described above reflect the evaluation results of the actually manufactured escape gear wheel part.

According to Example 7, an escape gear wheel part with excellent decorativeness was obtained.

What is claimed is:

1. A watch component configured for use in a watch, the watch component comprising:
    a base member including a first surface and a second surface opposite the first surface, the base member being mainly composed of silicon and being shaped as the watch component; and
    a light reflecting layer provided at the first surface of the base member, the light reflecting layer having a three-layer structure in which a first silicon oxide layer, a silicon layer, and a second silicon oxide layer are layered in this order,
    wherein a maximum reflectance for light having a wavelength in a range from 400 nm to 780 nm, when the light is incident on the light reflecting layer at an incident angle of 0°, is 50% or greater.

2. The watch component according to claim 1, wherein an average thickness of the second silicon oxide layer is smaller than an average thickness of the first silicon oxide layer.

3. The watch component according to claim 1, wherein an average thickness of the silicon layer is from 66 nm to 86 nm.

4. The watch component according to claim 2, wherein an average thickness of the silicon layer is from 66 nm to 86 nm.

5. The watch component according to claim 1, wherein an average thickness of the first silicon oxide layer is from 100 nm to 400 nm.

6. The watch component according to claim 2, wherein the average thickness of the first silicon oxide layer is from 100 nm to 400 nm.

7. The watch component according to claim 3, wherein an average thickness of the first silicon oxide layer is from 100 nm to 400 nm.

8. The watch component according to claim 1, wherein a light reflecting layer having a three-layer structure in which a first silicon oxide layer, a silicon layer, and a second silicon oxide layer are layered in this order is further provided at the second surface of the base member.

9. The watch component according to claim 2, wherein a light reflecting layer having a three-layer structure in which a first silicon oxide layer, a silicon layer, and a second silicon oxide layer are layered in this order is further provided at the second surface of the base member.

10. The watch component according to claim 3, wherein a light reflecting layer having a three-layer structure in which a first silicon oxide layer, a silicon layer, and a second silicon oxide layer are layered in this order is further provided at the second surface of the base member.

11. The watch component according to claim 1, wherein a light reflecting layer having a three-layer structure in which a first silicon oxide layer, a silicon layer, and a second silicon oxide layer are layered in this order is further provided at a side surface where the first surface and the second surface are coupled.

12. The watch component according to claim 2, wherein a light reflecting layer having a three-layer structure in which a first silicon oxide layer, a silicon layer, and a second silicon oxide layer are layered in this order is further provided at a side surface where the first surface and the second surface are coupled.

13. The watch component according to claim 3, wherein a light reflecting layer having a three-layer structure in which a first silicon oxide layer, a silicon layer, and a second silicon oxide layer are layered in this order is further provided at a side surface where the first surface and the second surface are coupled.

14. The watch component according to claim 1, wherein the watch component is at least one selected from the group consisting of a barrel, a wheel, an escape wheel, an anchor, and a balance.

15. A method for manufacturing a watch component, the method comprising forming a light reflecting layer at a first surface of a base member including the first surface and a second surface opposite the first surface, the base member being mainly composed of silicon, the light reflecting layer having a three-layer structure in which a first silicon oxide layer, a silicon layer, and a second silicon oxide layer are layered in this order.

16. The method for manufacturing a watch component according to claim 15, wherein at least one of the first silicon oxide layer and the second silicon oxide layer is formed by a thermal oxidation method.

17. The method for manufacturing a watch component according to claim 15, wherein the silicon layer is formed by a low-pressure CVD method.

18. A watch movement comprising the watch component according to claim 1.

19. A watch comprising the watch component according to claim 1.

20. A watch component configured for use in a watch, the watch component comprising:
- a base member including a first surface and a second surface opposite the first surface, the base member being mainly composed of silicon and being shaped as the watch component; and
- a light reflecting layer provided at the first surface of the base member, the light reflecting layer having a three-layer structure in which a first silicon oxide layer, a silicon layer, and a second silicon oxide layer are layered in this order, wherein an average thickness of the silicon layer is from 66 nm to 86 nm.

\* \* \* \* \*